United States Patent [19]
Takahashi et al.

[11] Patent Number: 5,679,268
[45] Date of Patent: Oct. 21, 1997

[54] THIN MULTI-LAYER CIRCUIT BOARD AND PROCESS FOR FABRICATING THE SAME

[75] Inventors: Yasuhito Takahashi; Yasunaga Kurokawa; Kenji Iida, all of Kawasaki; Masaru Sumi, Yonago; Yuichiro Ohta, Yonago; Toshiro Katsube, Yonago; Kazuo Nakano, Kawasaki; Norikazu Ozaki, Kawasaki; Hiroyuki Katayama, Kawasaki, all of Japan

[73] Assignee: Fujitsu Limited, Kawasaki, Japan

[21] Appl. No.: 359,448

[22] Filed: Dec. 20, 1994

[30] Foreign Application Priority Data

Feb. 25, 1994 [JP] Japan ............ 6-028384

[51] Int. Cl.[6] ................................ H05H 3/00
[52] U.S. Cl. ................................ 216/18; 216/13
[58] Field of Search ................ 216/13, 17, 18

[56] References Cited

U.S. PATENT DOCUMENTS

| | | | |
|---|---|---|---|
| 5,118,385 | 6/1992 | Kumar et al. | 216/18 |
| 5,274,912 | 1/1994 | Olenick et al. | 216/18 X |
| 5,329,695 | 7/1994 | Traskos et al. | 216/20 X |
| 5,459,634 | 10/1995 | Nelson et al. | 216/18 X |

*Primary Examiner*—Thi Dang
*Attorney, Agent, or Firm*—Staas & Halsey

[57] ABSTRACT

A process for fabricating thin multi-layer circuit boards which allow the electrical conduction of remodeling pads to be easily cut do not use etching for gold, avoid the lift-off method for forming a thin chromium film on the wiring pattern layer, allow a defective wiring pattern layer to be removed, and which uses uniform heating of the substrate, from the back side thereof, at the time of pre-baking. A barrier metal (60) is excluded from a portion where the electrical conduction of a remodeling pad (62b) is to be cut (FIGS. 1 to 16). Alternatively, gold-plating resist is formed in order to avoid the etching for gold (FIGS. 17 to 19). Alternatively, a thin chromium film is formed in advance by etching on the wiring pattern layer (FIGS. 27 to 33). Alternatively, a metallic barrier film (122) is formed on each of the wiring pattern layers so that the wiring pattern layer can be removed without affecting other wiring pattern layers (FIGS. 36 to 42). Alternatively, the substrate is disposed over a heat-accumulating block (138) adjacent thereto so that it is uniformly heated from the back side thereof during the pre-baking.

21 Claims, 33 Drawing Sheets

THIN MULTI-LAYER CIRCUIT BOARD AND PROCESS FOR FABRICATING THE SAME

BACKGROUND OF THE INVENTION

1. Field of the Invention

The present invention relates to a process for fabricating a thin multi-layer circuit board on which can be mounted many electronic parts, such as integrated circuits (ICs) and large size integrated circuits (LSIs).

2. Related Art

There has been known a thin multi-layer circuit board which is obtained by forming an insulating layer on a plate-like substrate made of a suitable insulating material and interposing at least two wiring pattern layers in this insulating layer. The two wiring pattern layers are connected to each other at a suitable place through a via and the two wiring pattern layers constitute a predetermined circuit pattern. Moreover, on the surface of the thin multi-layer circuit board are provided electronic part-mounting pads to which can be connected the leads of electronic parts, the electronic part-mounting pads being connected through vias to the wiring pattern layers in the insulating layer.

SUMMARY OF THE INVENTION

An object of the present invention is to provide a thin multi-layer circuit board which is so constituted that, when a remodeling pad is being used, this remodeling pad can be easily cut, and a process for fabricating the same.

Another object of the present invention is to provide a process for fabricating a thin multi-layer circuit board, which does not require a process for etching gold plating at the time of forming a pad by plating gold on the thin multi-layer circuit board.

A further object of the present invention is to provide a process for fabricating a thin multi-layer circuit board which is capable of forming a thin chromium film on the wiring pattern layers without relying upon the lift-off method when a number of wiring pattern layers are stacked on an insulating plate-like substrate.

A still further object of the present invention is to provide a process for fabricating a thin multi-layer circuit board which is capable of removing a defective wiring pattern layer without damaging the wiring pattern layers on the lower side when a number of wiring patterns are stacked on an insulating plate-like substrate.

A yet further object of the present invention is to provide a method of pre-baking a photosensitive polyimide resin layer that is applied in the fabrication of a multi-layer circuit board, the pre-baking method making it possible not only to uniformly heat the insulating plate-like substrate from the back side thereof but also to carry out the operation with excellent efficiency, as well as to provide a heat-accumulating block used for the method of pre-baking.

According to a first aspect of the present invention, there is provided a process for fabricating thin multi-layer circuit boards by alternately stacking wiring pattern layers and insulating layers on an insulating plate-like substrate, and electrically connecting said wiring pattern layers through vias in said insulating layers in order to construct a predetermined circuit pattern Using said wiring pattern layers, wherein a barrier metal exclusion zone is prepared by forming a metallic barrier layer on said wiring pattern layer in an electronic part-mounting region, a remodeling pad layer is formed on said metallic barrier layer neighboring said barrier metal exclusion zone, and an electronic part-mounting pad layer is formed at a location neighboring said remodeling pad layer.

According to the first aspect of the present invention, furthermore, there is provided a thin multi-layer layer circuit board which is obtained by alternately stacking wiring pattern layers and insulating layers on an insulating plate-like substrate, and electrically said insulating layers in order to (i.e., construct) interconnecting said wiring pattern layers through vias in predetermined circuit pattern by said wiring pattern layers, wherein a metallic barrier layer is formed on the wiring pattern layer in an electronic part-mounting region, a barrier metal exclusion zone is included in said metallic barrier layer, and a remodeling pad layer and an electronic part-mounting pad layer are formed on said metallic barrier layer, said remodeling pad layer being arranged in a location neighboring said barrier metal exclusion zone and said electronic part-mounting pad layer being arranged in a location neighboring said remodeling pad layer.

In the process for fabrication of the thin multi-layer circuit board according to the first aspect of the present invention as described above, the barrier metal exclusion zone is prepared in a location neighboring the remodeling pad layer. In using the remodeling pad, therefore, the wiring pattern layer is cut by a YAG laser along the barrier metal exclusion zone in order to cut the electrical connection between the remodeling pad and the wiring pattern layer. Therefore, destruction of the insulating layer in the thin multi-layer circuit board is minimized. Moreover, the barrier metal is formed of a sufficient thickness making it possible to prevent the barrier metal from being corroded at the time of soldering lead wires onto the electronic part-mounting pad and onto the remodeling pad.

According to a second aspect of the present invention, there is provided a process for fabricating thin multi-layer circuit boards by alternately stacking wiring pattern layers and insulating layers on an insulating plate-like substrate, and electrically interconnecting said wiring pattern layers through vias in said insulating layers in order to constitute a predetermined circuit pattern by said wiring pattern layers, wherein a metallic barrier layer is formed on the wiring pattern layer in an electronic part-mounting region, a pad-forming resist is formed in said metallic barrier layer, a gold pad layer of a predetermined shape is formed on said metallic barrier layer by using said pad-forming resist, and said pad-forming resist is removed.

According to the second aspect of the present invention, there is provided a process for fabricating thin multi-layer circuit boards by alternately stacking wiring pattern layers and insulating layers on an insulating plate-like substrate, and electrically connecting said wiring pattern layers through vias in said insulating layers in order to constitute a predetermined circuit pattern by said wiring pattern layers, wherein a pad-forming resist is formed on the wiring pattern layer in an electronic part-mounting region, a metallic barrier layer is formed on the wiring pattern layer, a gold pad layer of a predetermined shape is formed on the metallic barrier layer using the pad-forming resist, and said pad-forming resist is removed.

In the process for fabrication according to the second aspect of the present invention, the gold pad layer is formed into a predetermined shape by using the pad-forming resist and without the need of using a highly toxic gold-etching solution, contributing to the safety of the operation.

According to a third aspect of the present invention, there is provided a process for fabricating thin multi-layer circuit boards by alternately stacking wiring pattern layers and insulating layers on an insulating plate-like substrate, and electrically connecting said wiring pattern layers through vias in said insulating layers in order to constitute a predetermined circuit pattern by said wiring pattern layers, wherein the wiring pattern layers are formed on the insulating layers by sequentially forming a first thin chromium film, a copper layer and a second thin chromium film on said insulating layers, followed by etching.

In the process for fabrication according to the third aspect of the present invention, the wiring pattern layers on the insulating layers are formed by sequentially forming the first thin chromium film, the copper layer and the second thin chromium film on the insulating layers followed by etching. Therefore, there is no need for employing a lift-off method for forming the second thin chromium film on the insulating layers.

According to a fourth aspect of the present invention, there is provided a process for fabricating thin multi-layer circuit boards by alternately stacking wiring pattern layers and insulating layers on an insulating plate-like substrate, and electrically connecting said wiring pattern layers through vias in said insulating layers in order to constitute a predetermined circuit pattern by said wiring pattern layers, wherein a metallic barrier film covers the wiring pattern layer every time a wiring pattern layer is formed. The metallic barrier film can be formed by either a lift-off method or an etching method. When each wiring pattern layer is made up of a thin chromium film and a copper layer formed on the thin chromium film, the metallic barrier film covers the copper layer. When each wiring pattern layer is made up of a first thin chromium film, a copper layer formed on the thin chromium film and a second thin chromium film formed on the copper layer, the metallic barrier film covers the second thin chromium film.

In the process for fabrication according to the fourth aspect of the present invention, the metallic barrier film covers the wiring pattern layer every time a wiring pattern layer is formed. Therefore, a defective wiring pattern layer can be removed by wet-etching, and the etching solution is prevented from infiltrating into the wiring pattern layers of the lower side. It is therefore possible to form the wiring pattern again after a defective wiring pattern layer is removed, contributing greatly to decreasing the cost of producing the thin multi-layer circuit board.

According to a fifth aspect of the present invention, there is provided a method of pre-baking a photosensitive polyimide resin layer in a process for fabricating thin multi-layer circuit boards by alternately stacking wiring pattern layers and insulating layers on an insulating plate-like substrate, and electrically connecting said wiring pattern layers through vias in said insulating layers in order to constitute a predetermined circuit pattern by said wiring pattern layers, wherein a heat-accumulating block is arranged in an atmosphere of a predetermined temperature, and said insulating plate-like substrate is placed over the heat-accumulating block close thereto and is heated. Desirably, a gap of about 0.3 mm is maintained between the heat-accumulating block and the insulating plate-like substrate. Desirably, the heat-accumulating block is constituted by a block member having a flat heating surface, a pair of guide walls that extend in parallel along the opposing side edges of the heating surface of the block member, and rail elements that extend along the corners formed by the pair of guide walls and the heating surface, and the pair of guide walls have a lateral width which is slightly larger than a distance between the opposing side edges on one side of the insulating plate-like substrate.

In the pre-baking method according to the fifth aspect of the present invention, the heat-accumulating block is disposed in an atmosphere heated at a predetermined temperature, the insulating plate-like substrate is placed over the heat-accumulating block close thereto and is heated. Therefore, the insulating plate-like substrate can be uniformly heated from the back side thereof without being stuck to the heat-accumulating block. With the heat-accumulating block according to the fifth aspect of the present invention, furthermore, the insulating plate-like substrate is placed on the rail elements from the ends on one side of the pair of guide walls and is moved over the flat surface of the heat-accumulating block and is pulled out by being placed on the rail elements. Therefore, even when a plurality of such heat-accumulating blocks are arranged to be stacked in an oven, the insulating plate-like substrates can be easily put into, and pulled out of, the heat-accumulating blocks.

DETAILED DESCRIPTION OF THE PREFERRED EMBODIMENTS

Before a detailed explanation of some embodiments of the present invention is given, a conventional process for producing a thin multi-layer circuit board will be described with reference to the accompanying FIGS. 49 to 72.

Figure 49:
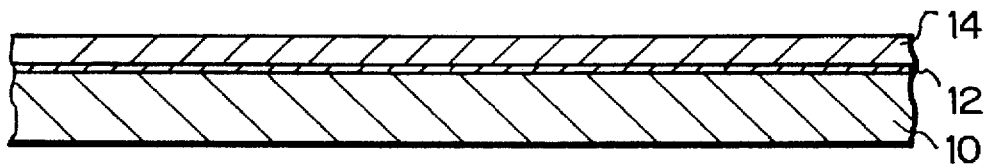
FIGS. 49 to 72 are diagrams schematically illustrating the steps in a conventional representative process for fabricating thin multi-layer circuit boards.
Figure 50:
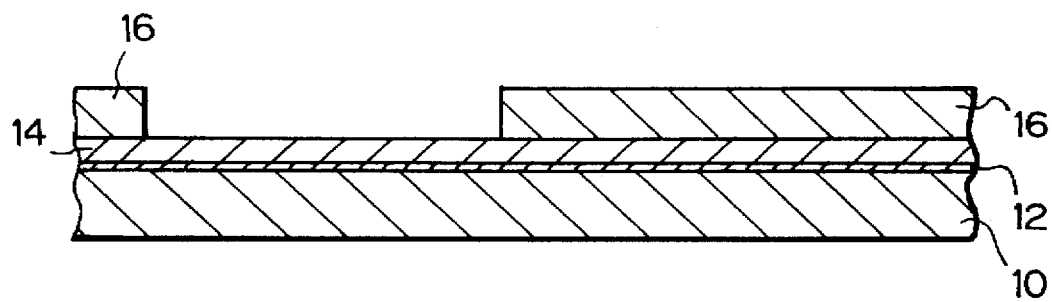
Figure 51:
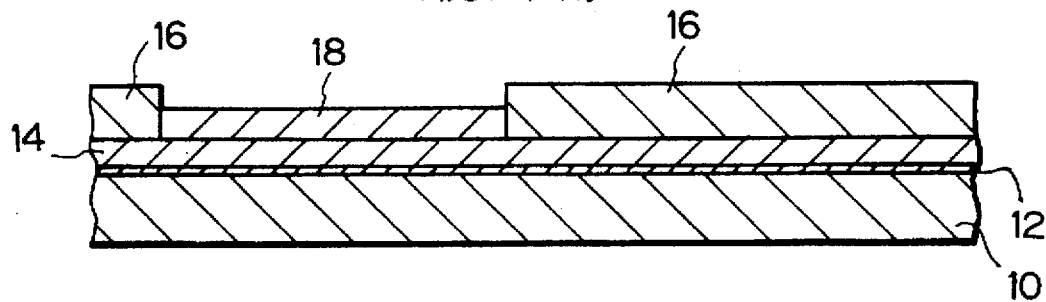
Figure 52:
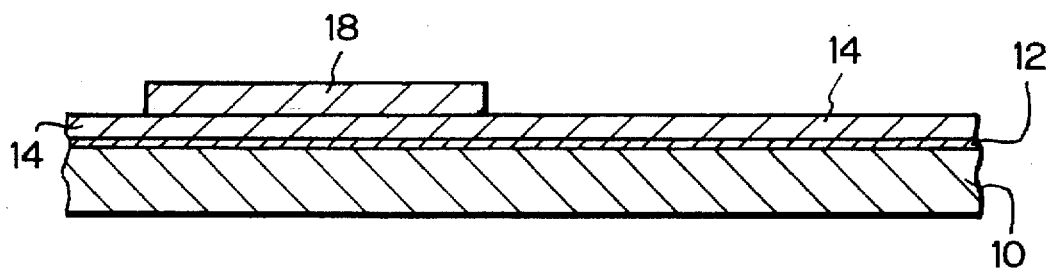
Figure 53:
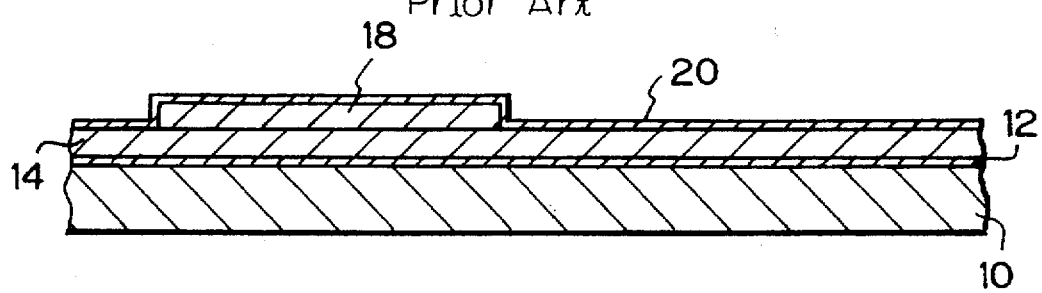
Figure 54:
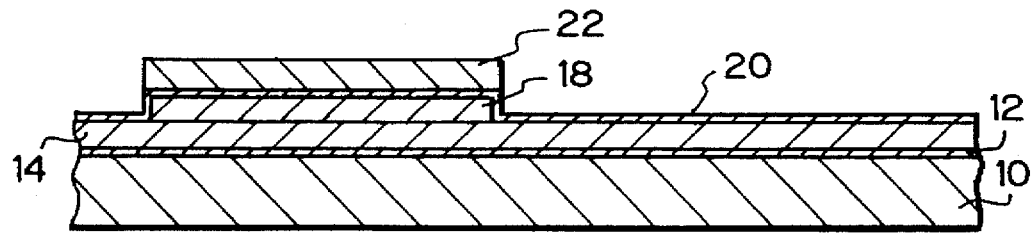
Figure 55:
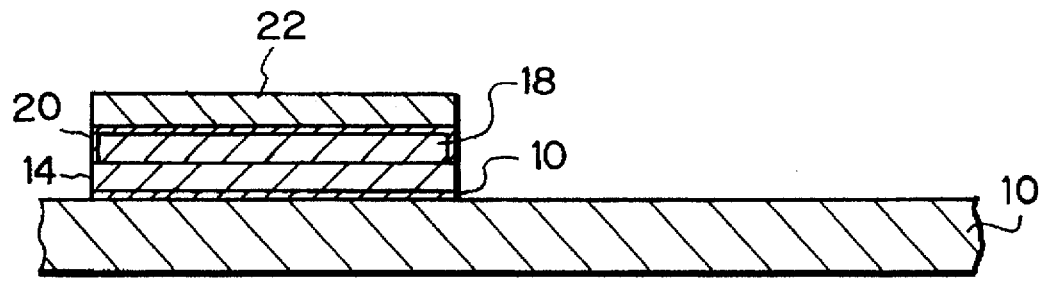
Figure 56:
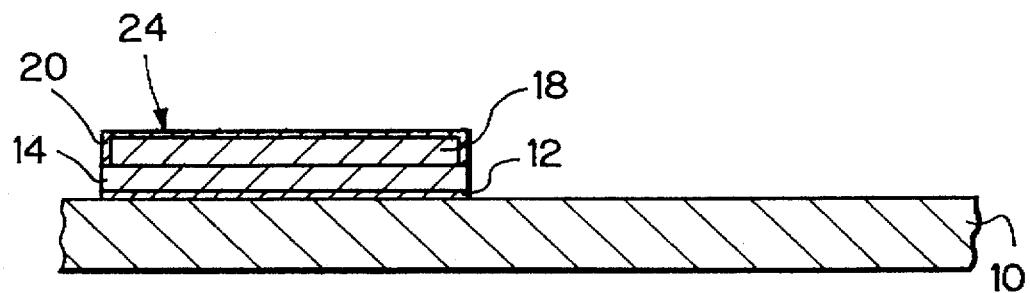

Referring, first, to FIG. 49, a thin chromium film 12 is formed on, for example, a ceramic substrate 10, and a thin copper film 14 is formed on the thin chromium film 12. The thin chromium film 12 and the thin copper film 14 are usually formed by sputtering. Then, in order to form a first wiring pattern on the thin copper film 14, a copper-plating resist 16 is formed on the thin copper film 14 as shown in FIG. 50. By plating copper on the copper-plating resist 16, a copper-plated layer 18 is formed on the first wiring pattern as shown in FIG. 51. After the copper-plated layer is formed, the copper-plating resist 16 is removed as shown in FIG. 52. and, then, a thin chromium film 20 is formed again on the thin copper film 14 and on the copper-plated layer 18 as shown in FIG. 53. Referring next to FIG. 54, an etching resist 22 is formed on the first wiring pattern. Then, by effecting the etching, the thin copper film 14 and the thin chromium film 12 are removed from the regions other than the first wiring pattern as shown in FIG. 55. Thereafter, the etching resist 22 is removed to obtain a first wiring pattern layer 24 on the ceramic substrate 10 as shown in FIG. 56. The thin chromium film 12 has a thickness of, for example, about 0.08μ, the thin chromium film 22 has a thickness of, for example, about 0.15μ, and copper layers (12, 18) sandwiched between these thin chromium films have a thickness of, for example, about 5μ.

Figure 57:
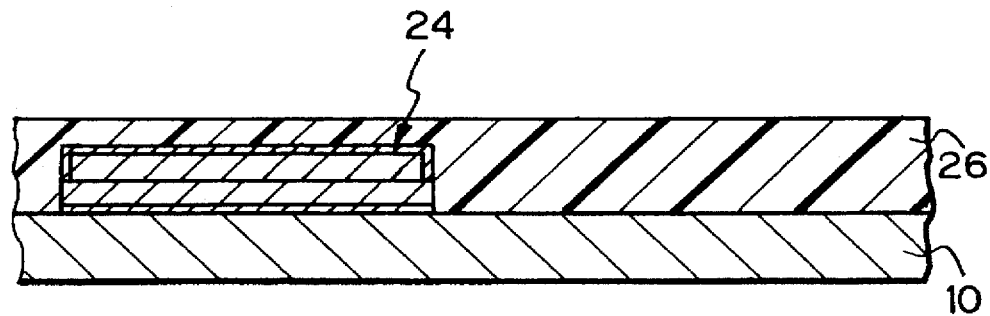
Figure 58:
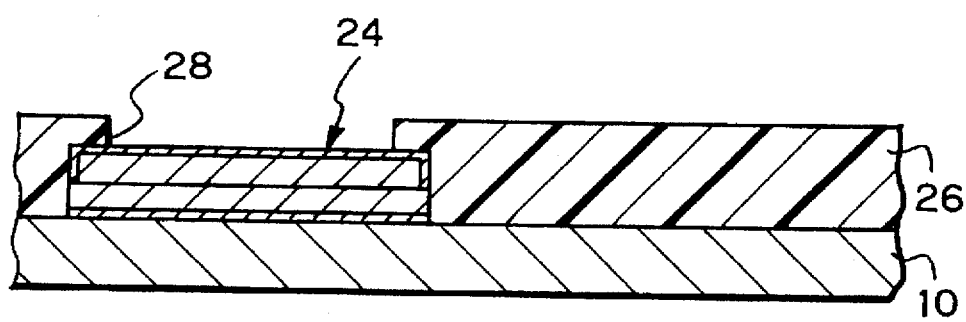
Figure 59:
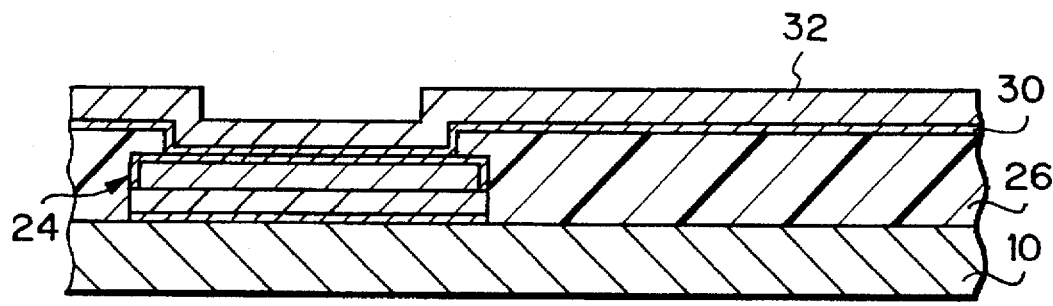
Figure 60:
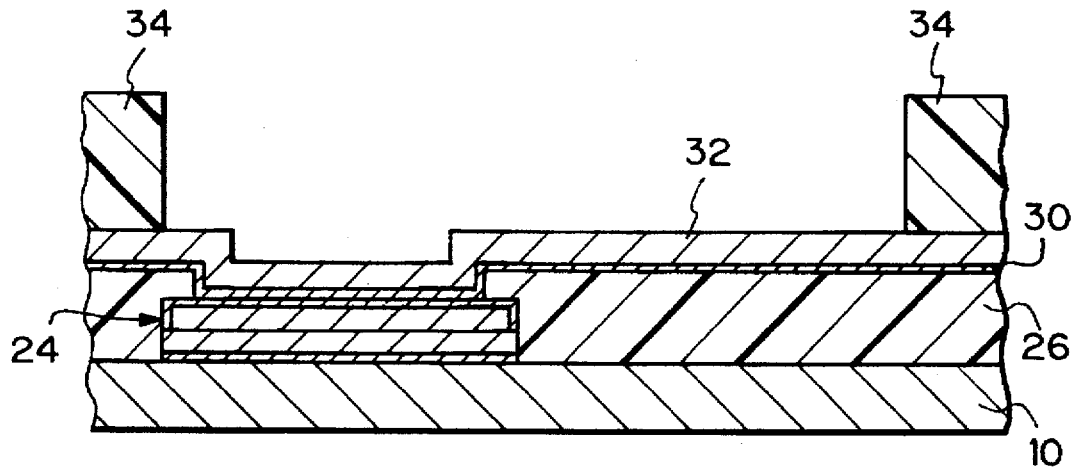
Figure 61:
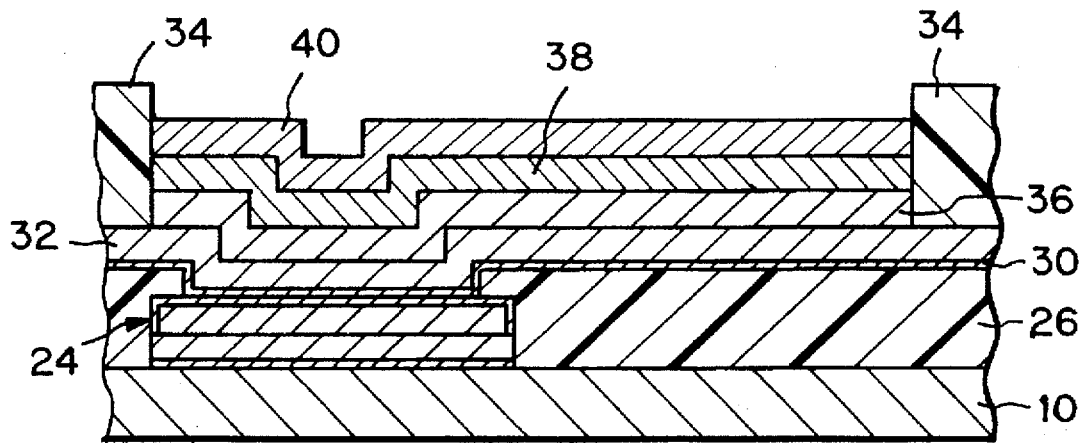

After the first wiring pattern layer 24 is formed on the ceramic substrate 10, an insulating layer such as a photosensitive polyimide resin layer 26 is applied thereon and is pre-baked as shown in FIG. 57. Then, the insulating layer 26 is developed by exposure to light through a predetermined pattern, and whereby a via hole 28 is formed at a predetermined portion of the insulating layer 26 as shown in FIG. 58. After the insulating layer 26 is cured, a thin chromium film 30 and a thin copper film 32 are formed thereon by sputtering as shown in FIG. 59. Then, in order to form a second wiring pattern on the thin copper film 32, a plating resist 34 is formed on the thin copper film 32 as shown in FIG. 60. By plating copper on the plating resist 34, a copper-plated layer 36 is formed on the second wiring pattern as shown in FIG. 61.

Figure 62:
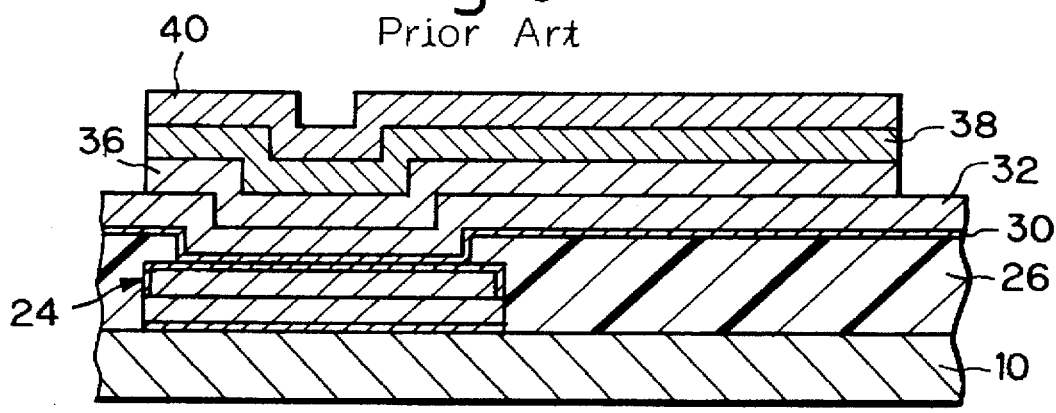
Figure 63:
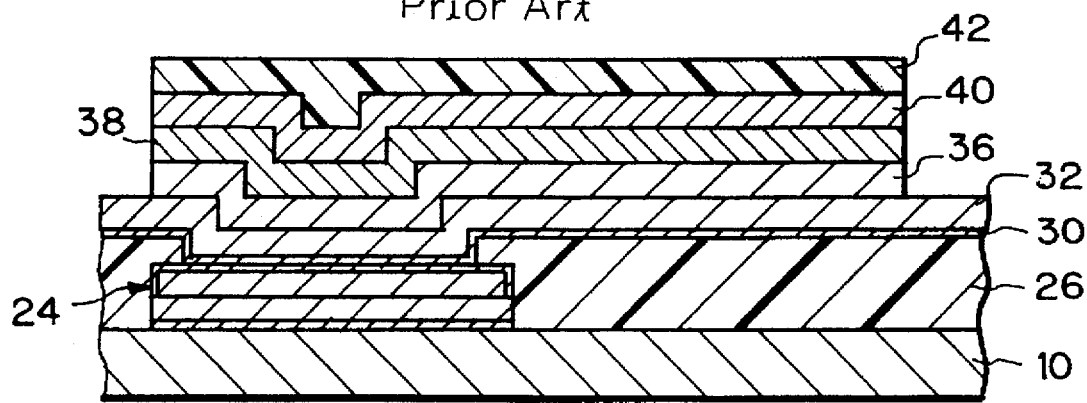
Figure 64:
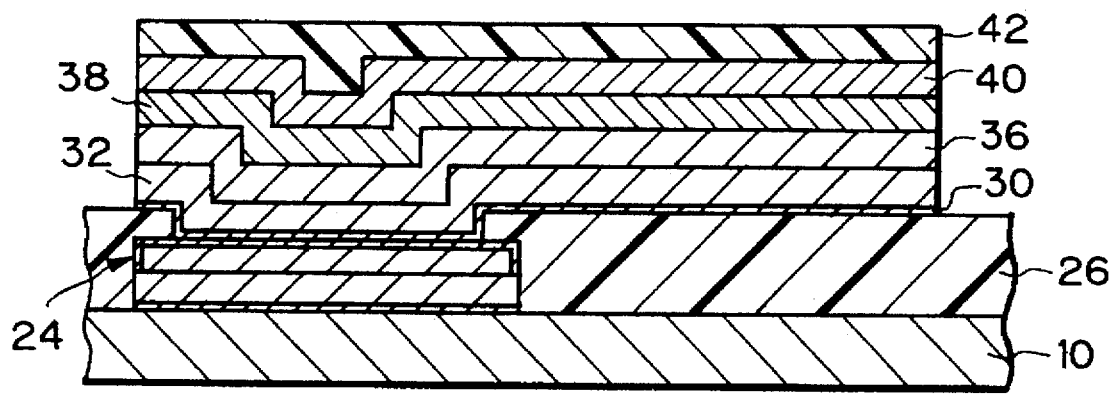
Figure 65:
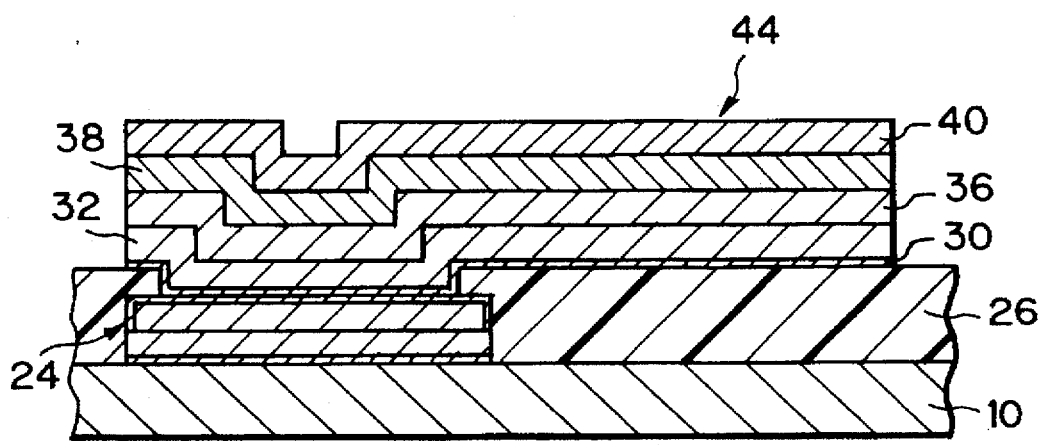

In the region, i.e., in the electronic part-mounting region shown in FIGS. 49 to 61, nickel and gold are further plated on the copper-plated layer 36 thereby to form a nickel-plated layer 38 and a gold-plated layer 40. Then, the plating resist 34 is removed as shown in FIG. 62. Referring next to FIG. 63, an etching resist 42 is formed on the second wiring pattern, followed by etching to remove the thin copper film 32 and the thin chromium film 30 from the regions other than the second wiring pattern as shown in FIG. 64. Thereafter, the etching resist 42 is removed to obtain a second wiring pattern 44 on the insulating layer 26 as shown in FIG. 65. As will be obvious from FIG. 65, the first wiring pattern layer 24 and the second wiring pattern layer 44 are connected to each other through conducting metals in a via hole, and a predetermined circuit pattern is constituted by these two wiring pattern layers 24 and 44. The thin chromium film 30 has a thickness of, for example, about 0.08μ, the copper layers (32, 36) on the thin chromium film 30 have a thickness of, for example, about 4μ, the nickel-plated layer 38 has a thickness of, for example, about 3μ, and the gold-plated layer 40 has a thickness of, for example, about 0.6μ.

Figure 66:
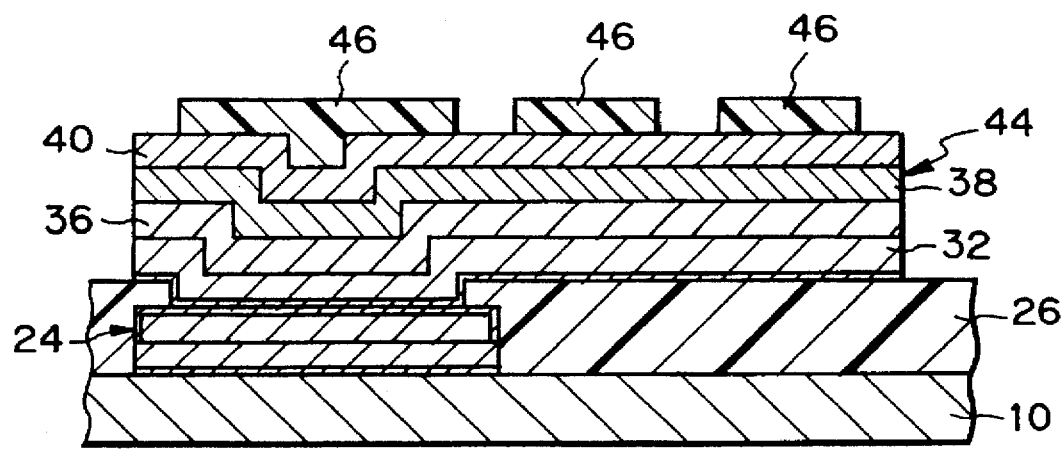
Figure 67:
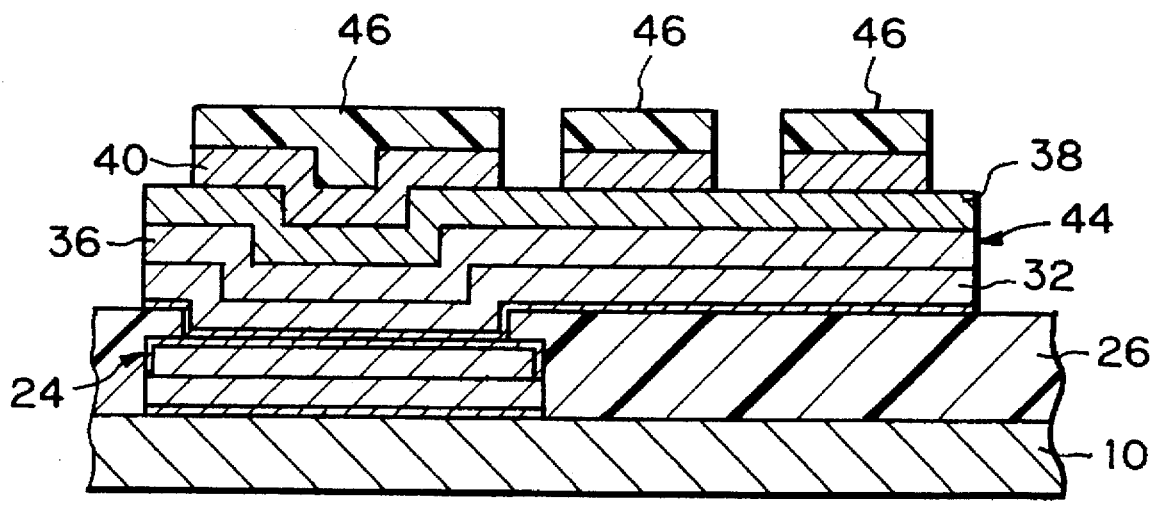
Figure 68:
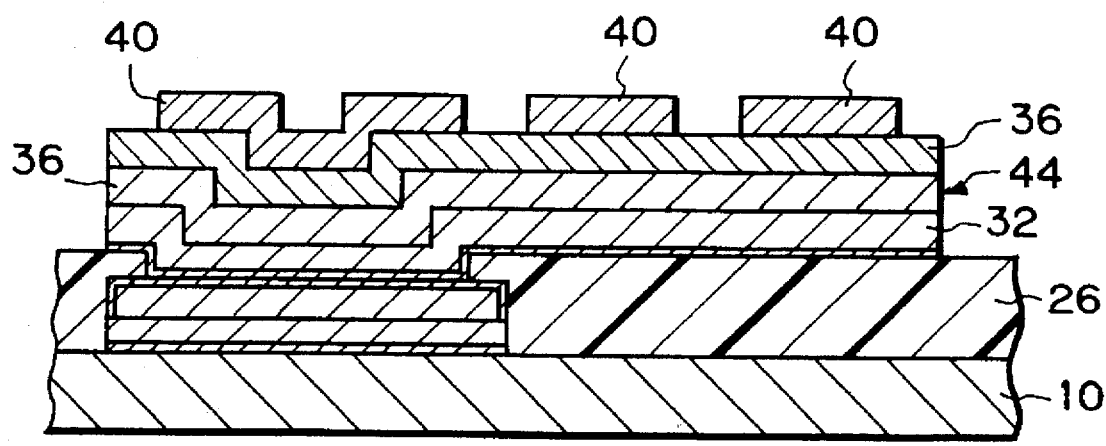
Figure 69:
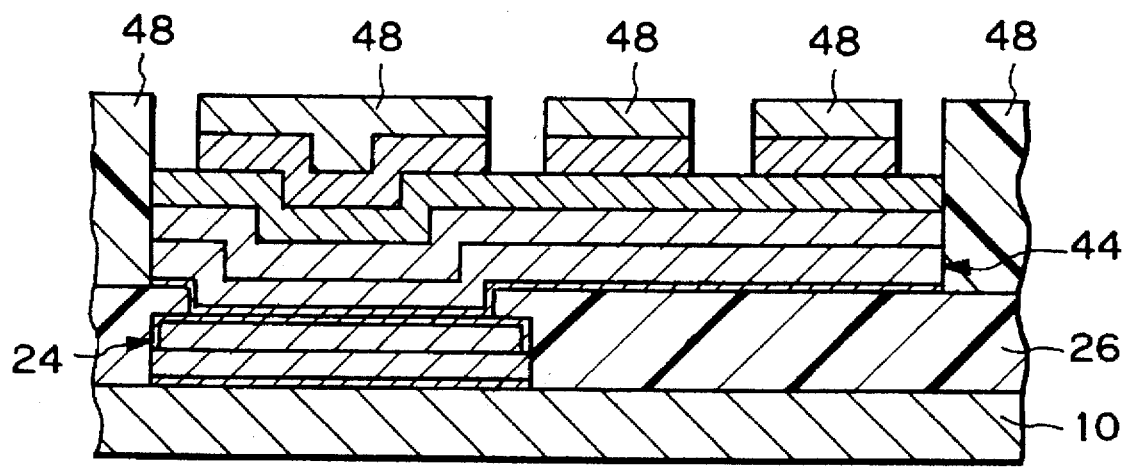
Figure 70:
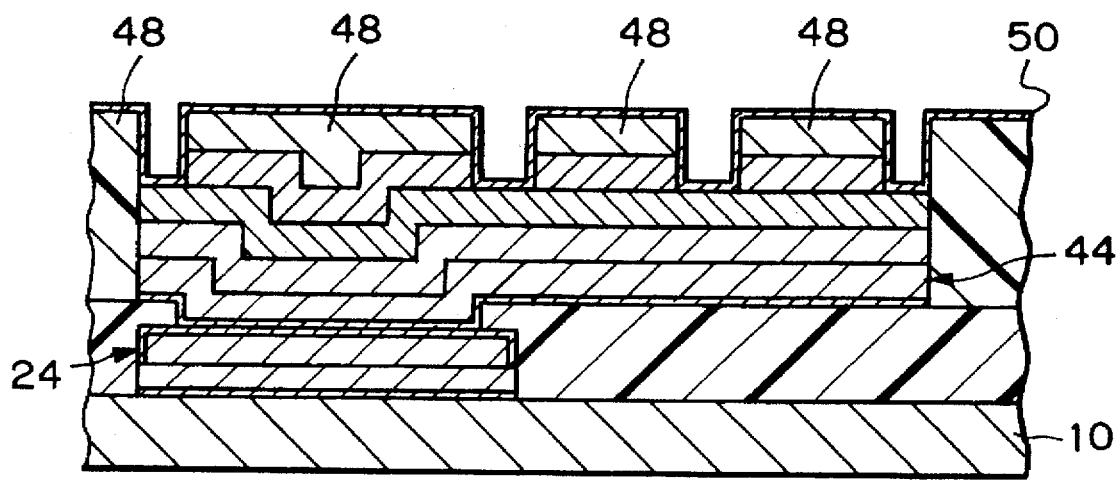
Figure 71:
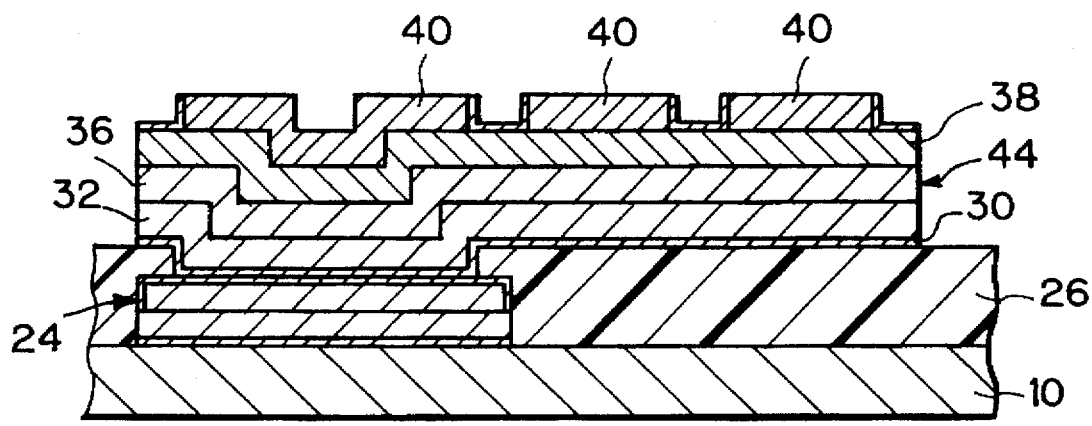

A gold-etching resist 46 is formed in a predetermined pattern on the electronic part-mounting region, i.e., on the gold-plated layer 40 as shown in FIG. 66, and then gold is removed by etching. As shown in FIG. 67, therefore, the gold-plated layer 40 is partly removed and the nickel-plated layer 38 is exposed. Thereafter, the gold-etching resist 46 is removed as shown in FIG. 68, and, then, a chromium lift-off resist 48 is formed on the insulating layer 26 in order to form a thin chromium film on the second wiring pattern layer 44. In this case, the chromium lift-off resist 48 is applied onto the gold-plated layer 40, too, as shown in FIG. 69. By effecting the chromium lift-off sputtering, a thin chromium film 50 is formed on the second wiring pattern layer 44 and on the chromium lift-off resist 48 as shown in FIG. 70. The chromium lift-off resist 48 is then removed as shown in FIG. 71, and the thin chromium film 50 is left on the second wiring pattern layer 44 only. Then, as shown in FIG. 72, an overcoat insulating layer 52 composed of a polyimide resin is applied onto the insulating layer 26 and onto the second wiring pattern layer 44, and the surface of the gold-plated layer 40 is exposed to obtain a thin multi-layer circuit board.

Figure 72:
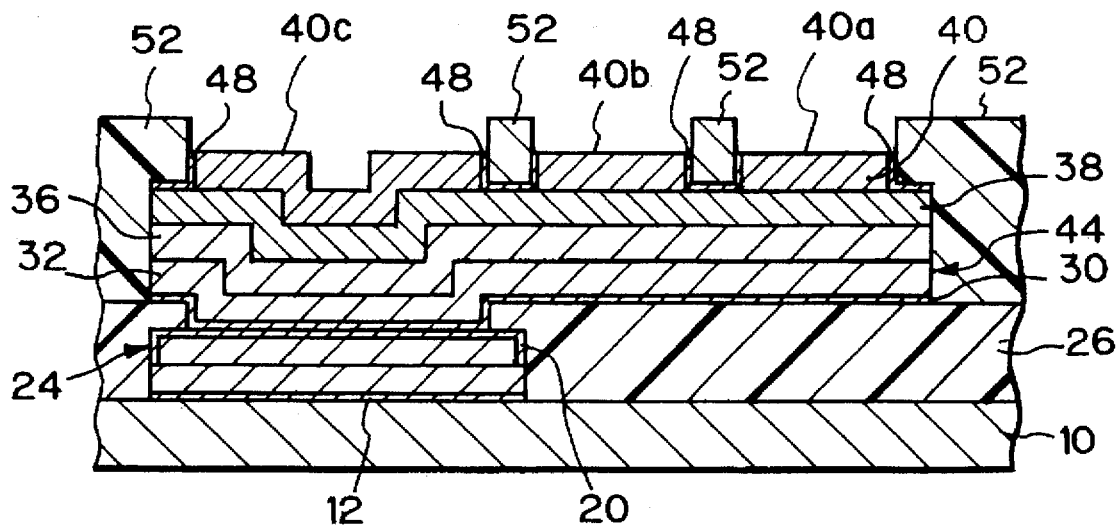

In the conventional thin multi-layer circuit board shown in FIG. 72, the gold-plated layer 40 is divided into three exposed pads 40a, 40b and 40c. The pad 40a serves as a part-mounting pad for soldering the lead wires when an electronic part is mounted. The pad 40b serves as a remodeling pad that is used for remodeling or repairing the circuit wiring, and is used for soldering the lead wires as required for remodeling or repairing the circuit wiring. The pad 40c is used for only electrically connecting the part-mounting pad 40a and the remodeling pad 40b to the wiring pattern layers 24 and 44. Depending upon the cases, the pad 40c may be covered with the overcoat insulating layer 52.

In the above-mentioned thin multi-layer circuit board, the nickel-plated layer 38 works as a metallic barrier layer for protecting the copper layers (32, 36) when a lead wire is soldered onto the part-mounting pad 40b, 40a and/or the remodeling pad. If described in detail, when there is no nickel-plated layer 38, the solder material permeates into the copper layers (32, 36) at the time of soldering, causing the electric properties and mechanical properties to change. In order to prevent the solder material from permeating into the copper layers (32, 36), therefore, the nickel-plated layer 38 is necessary. The nickel-plated layer 38 must have a thickness of at least 3μ so that it works as a metallic barrier layer to a sufficient degree. When the thickness is smaller than 3μ, the nickel-plated layer 38 corrodes at the time of soldering, causing a problem in that the solder material permeates into the copper layers (32, 36).

In the conventional thin multi-layer circuit board, however, the presence of a metallic barrier layer, i.e., the nickel-plated layer 38, becomes a problem at the time of remodeling or repairing the circuit wiring. That is, to remodel or repair the circuit wiring, the electrical connection between the remodeling pad 40b and the wiring pattern layers 24, 44 must be cut off. This is done by cutting the conductor layer between the remodeling pad 40b and the pad 40c by using a YAG laser beam. Here, however, a problem arises that the nickel-plated layer 38 cannot be desirably cut by the YAG laser beam. In particular, it becomes difficult to cut the nickel-plated layer 38 when its thickness exceeds 3μ. The nickel-plated layer 38 can be cut by increasing the output of the YAG laser beam but this causes the insulating layer 26 to be damaged to a large extent. It is not, therefore, possible to increase the output of the YAG laser beam. The thickness of the nickel-plated layer 38 can be decreased so that it can be easily cut by the YAG laser beam but this is accompanied by the problem of corrosion at the time of soldering.

Moreover, it has been pointed out that the conventional process for producing thin multi-layer circuit boards involves the processing for etching the gold-plated layer 40 (FIGS. 66 and 67). That is, the processing for etching the gold-plated layer 40 requires a strongly toxic solvent, and it is desirable to exclude such an etching processing from the steps of producing thin multi-layer circuit boards.

It has further been pointed out that the conventional process for producing thin multi-layer circuit boards employs a lift-off method for forming the thin chromium film 50 on the second wiring pattern layer 44 (FIGS. 69, 70, 71), which is another problem. That is, after the thin chromium film 50 is formed, it is not easy to remove the lift-off resist 48 and a relatively long period of time is required for the removal step.

In the conventional process for producing thin multi-layer circuit boards, furthermore, there is a problem in sequentially stacking a number of wiring pattern layers on the ceramic substrate. In detail, when ten wiring pattern layers, for instance, are stacked on the ceramic substrate, up to nine wiring pattern layers can be properly formed but the tenth wiring pattern layer may be broken or short-circuited. If this happens, the device must be discarded as a defective product. Attempts have been made to remove the defective wiring pattern layer by wet-etching and to form the wiring pattern again but this permits the etching solution to infiltrate into the lower wiring pattern layers through the via. Therefore, the lower wiring pattern layers are damaged, and this makes it difficult to form the wiring pattern layer again.

A further problem in the conventional process for producing thin multi-layer circuit boards resides in the pre-baking of the photosensitive polyimide resin. In detail, the photosensitive polyimide resin is used not only as an insulating material but also as a photoresist material at the time of forming a metal-plated layer. The polyimide resin is pre-baked when it is applied in the process for producing thin multi-layer circuit boards. Here, "pre-baking" means vaporizing the solvent by leaving the polyimide resin in an atmosphere heated to a temperature of about 80°. In this case, it is desirable to uniformly heat the ceramic substrate from the back side thereof. Thus, via holes and the like are formed with a high resolution in the polyimide resin layer by exposure to light and development. That is, via holes and the like can be formed accurately. For this purpose, a heat-accumulating block made of a material having excellent heat-accumulating property was placed in an oven and a ceramic substrate was placed on the heat-accumulating block in order to uniformly heat the ceramic substrate from the back side thereof. This resulted in failure because, although the ceramic substrate is uniformly heated, the polyimide resin that reached the back surface of the ceramic substrate when the polyimide resin was applied causes the ceramic substrate to stick onto the heat-accumulating block hindering the workability to a great extent.

Thus, in order to solve the above-mentioned problems and attain the objects of the present invention discussed hereinbefore, some embodiments of the first through fifth aspects of the present invention will be presented.

An embodiment of a process for fabricating thin multi-layer circuit boards according to a first aspect of the present invention will now be described with reference to FIGS. 1 to 17 of the accompanying drawings. The initial steps in the fabrication process according to the first aspect of the present invention are substantially the same as those of the conventional fabrication process described earlier, and are not mentioned again.

Figure 1:
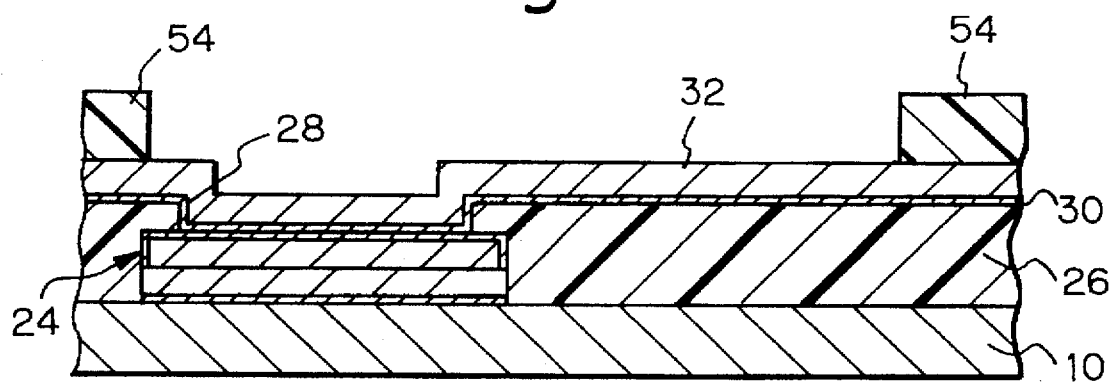
FIGS. 1 to 16 are diagrams schematically illustrating the steps in a process for fabricating thin multi-layer circuit boards according to a first aspect of the present invention.
Figure 2:
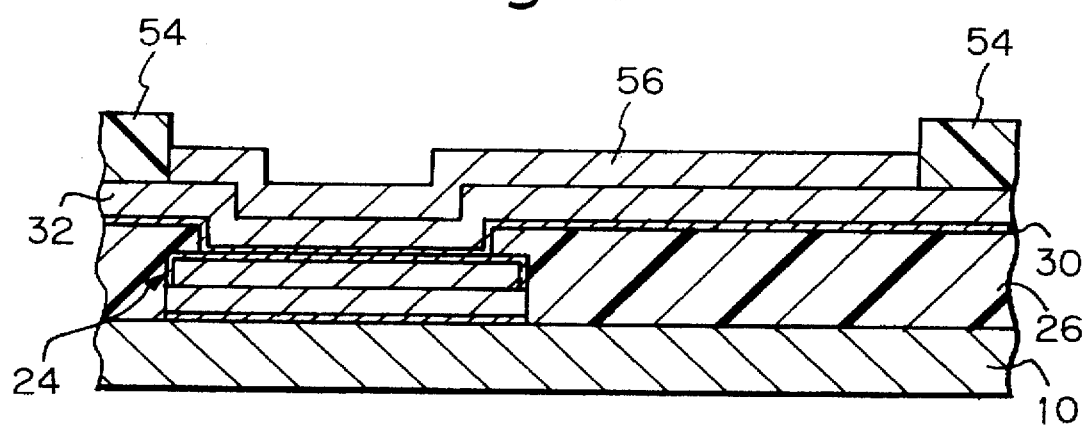
Figure 3:
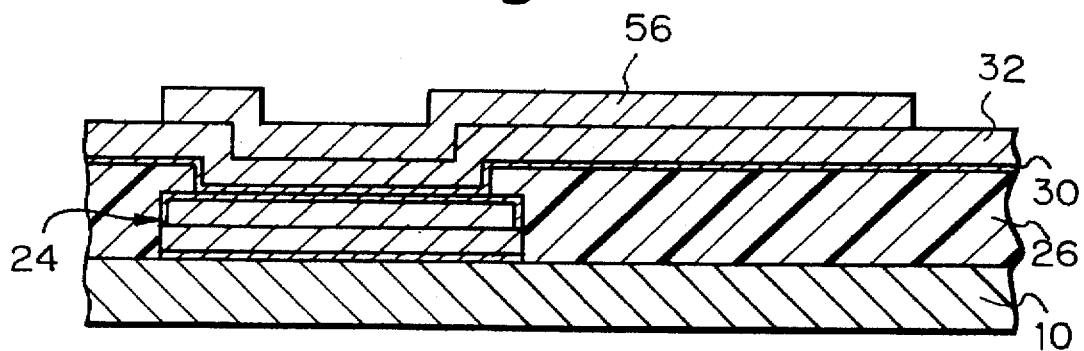

FIG. 1 illustrates a state where a first wiring pattern layer 24 is formed on a ceramic substrate 10, an insulating layer such as a photosensitive polyimide resin layer 26 is applied onto the first wiring pattern layer 24 and after pre-baked a via hole 28 is formed and, then, after the insulating layer 26 is cured, a thin chromium film 30 and a thin copper film 32 are formed by, for example, sputtering. On the thin copper film 32 is formed a copper-plating resist 54 for forming a second wiring pattern as shown in FIG. 1. When copper is plated on the copper-plating resist 54, a copper-plated layer 56 is formed on the second wiring pattern as shown in FIG. 2 and, thereafter, the copper-plating resist 54 is removed as shown in FIG. 3.

Figure 4:
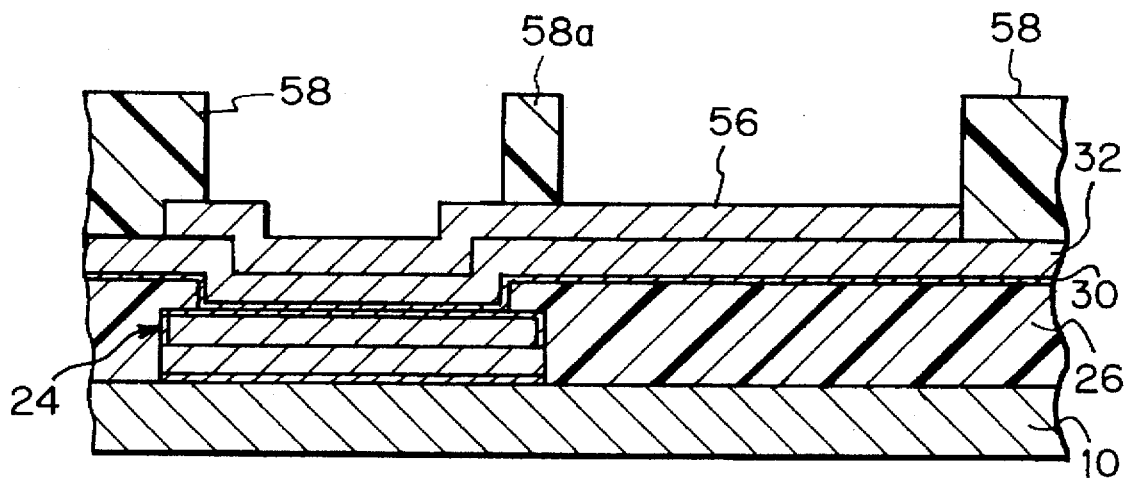
Figure 5:
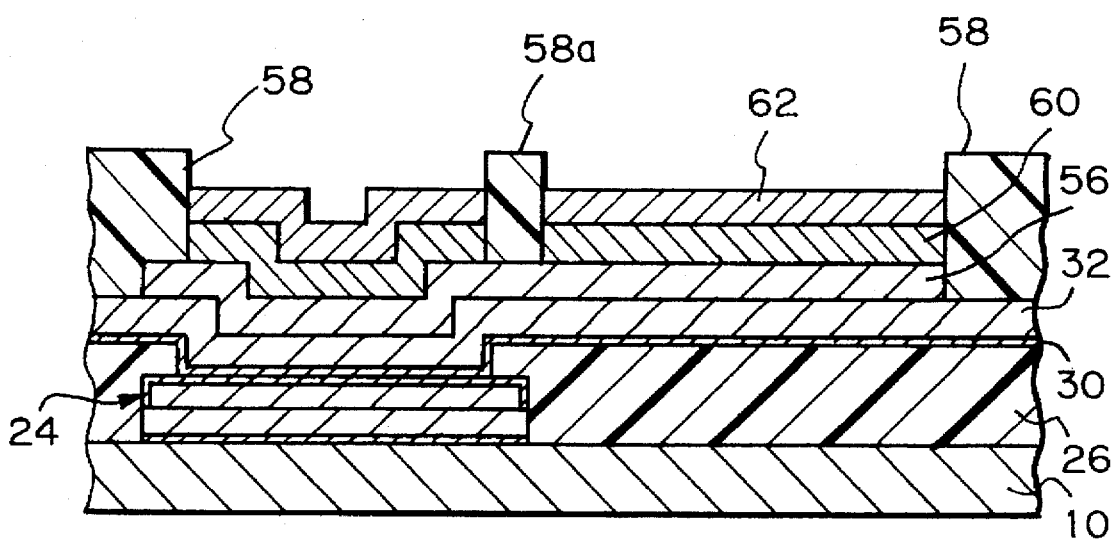
Figure 6:
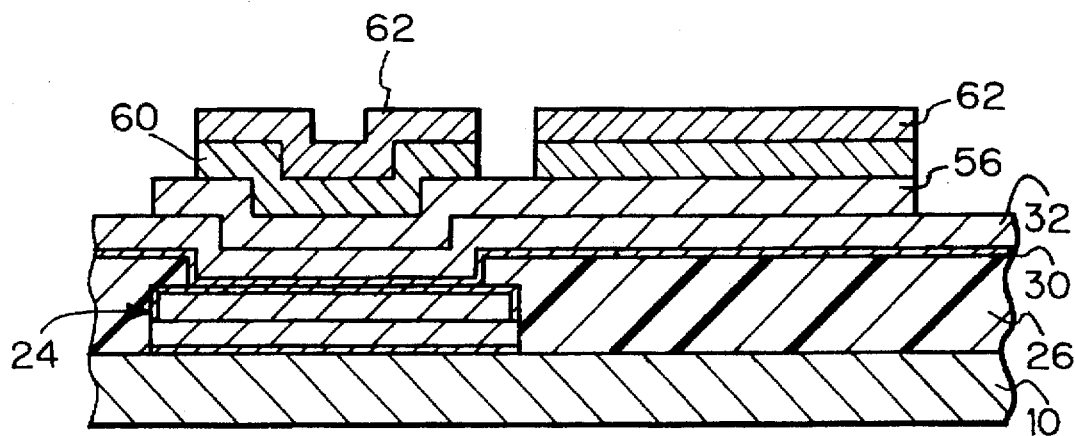

The diagramed region is an electronic part-mounting region. In this region, nickel and gold are further plated on the copper-plated layer 56. For this purpose, a plating resist 58 is formed as shown in FIG. 4. In this case, a plating resist 58a, too, is formed on the copper-plated layer 56 to prepare a nickel exclusion zone on a portion thereof. After the plating resist is formed, nickel is plated to form a nickel-plated layer 60 as shown in FIG. 5 and, then, gold is plated on the nickel-plated layer 60 to form a gold-plated layer 62. After the plating, the plating resist is removed as shown in FIG. 6. In this case, a zone on a part of the surface of the copper-plated layer 56, i.e., the zone to which the plating resist 58a is applied, turns into a nickel exclusion zone.

Figure 7:
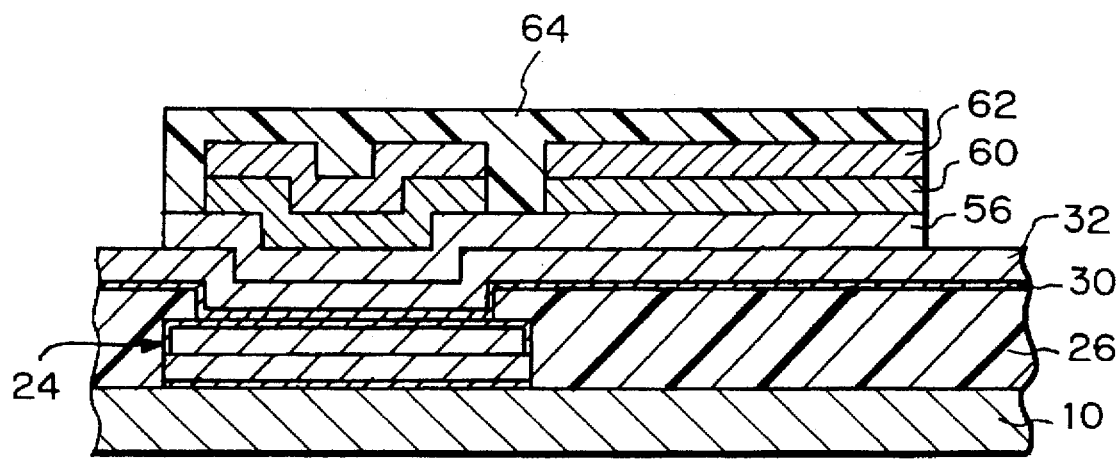
Figure 8:
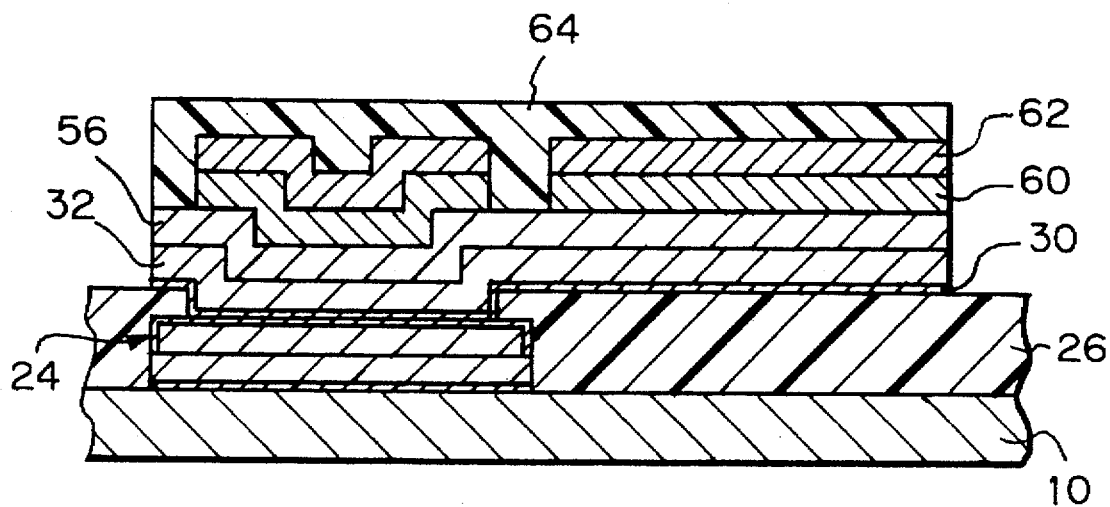
Figure 9:
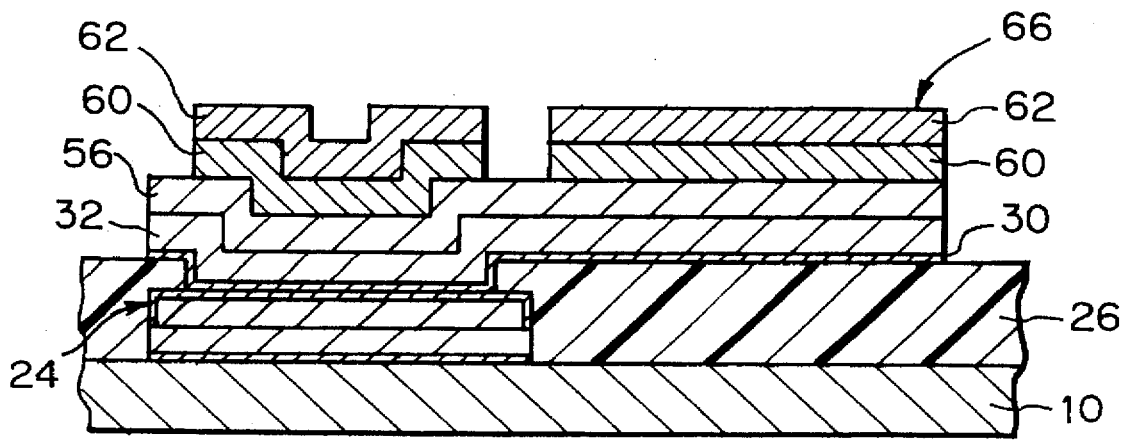

After the plating resist is removed, an etching resist 64 is formed on the second wiring pattern as shown in FIG. 7. By effecting the etching thereto, the thin copper film 32 and the thin chromium film 30 are removed from the regions other than the second wiring pattern as shown in FIG. 8. Then, the etching resist 64 is removed to obtain a second wiring pattern layer 66 on the insulating layer 26 as shown in FIG. 9. As will be obvious from FIG. 9, the first wiring pattern layer 24 and the second wiring pattern layer 66 are electrically connected together by conducting metals in the via hole, and whereby a predetermined circuit pattern is constituted by these two wiring pattern layers 24 and 66.

Figure 10:
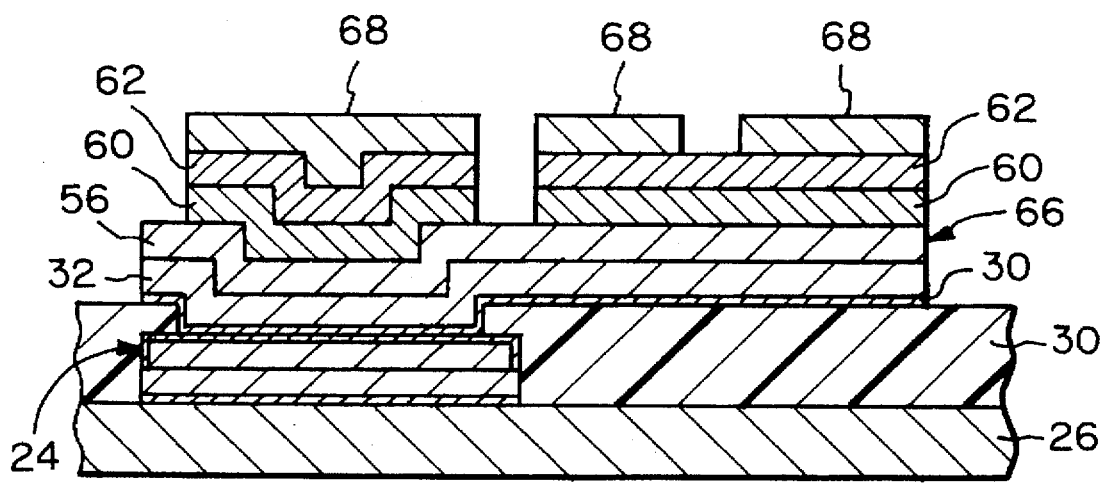
Figure 11:
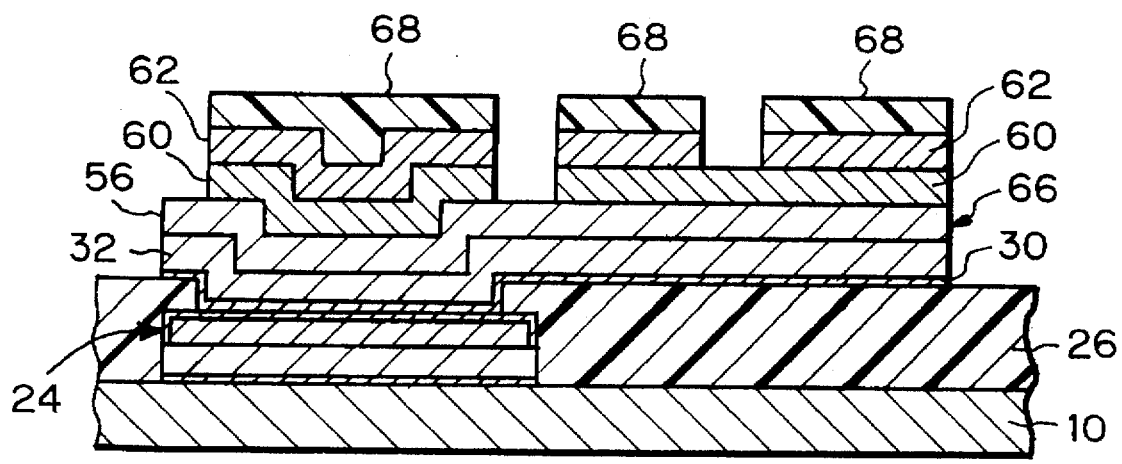
Figure 12:
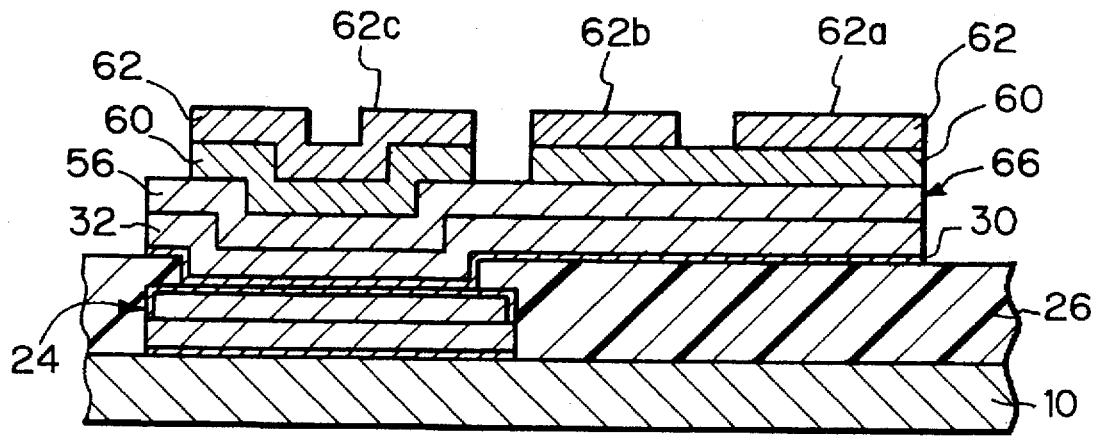
Figure 13:
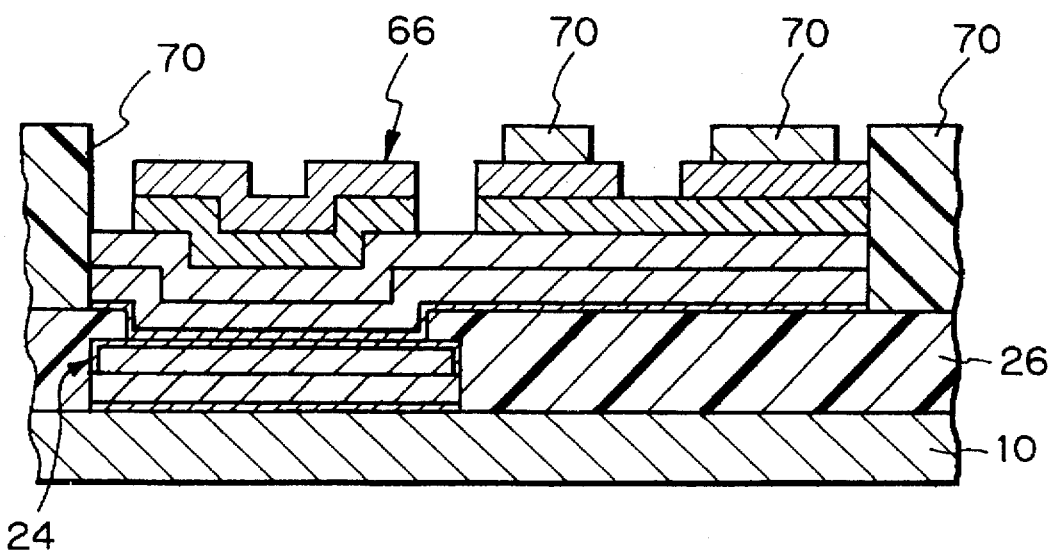
Figure 14:
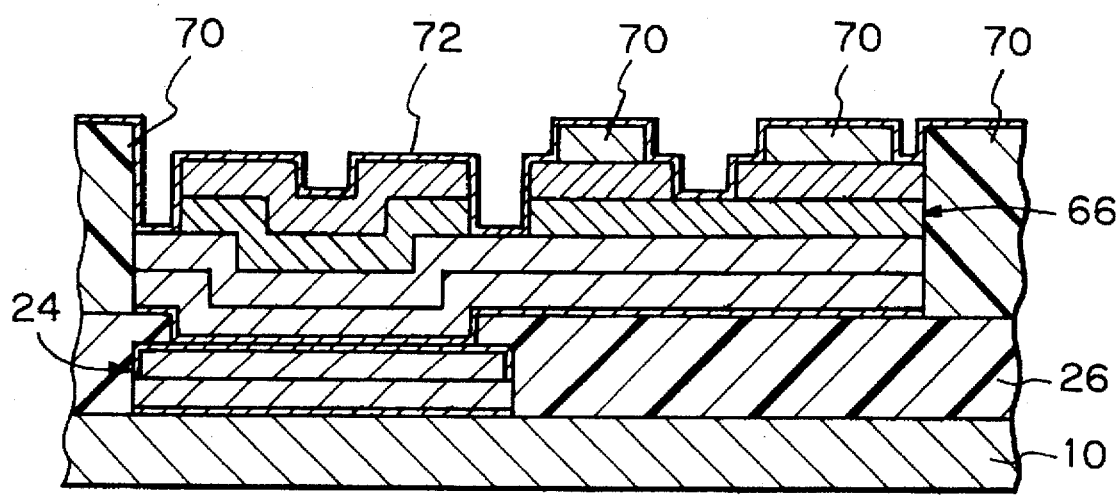
Figure 15:
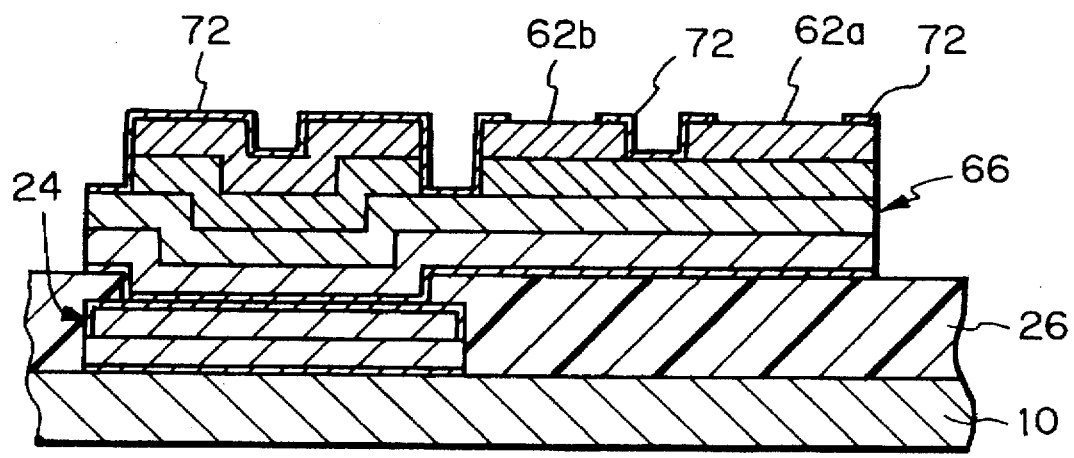
Figure 16:
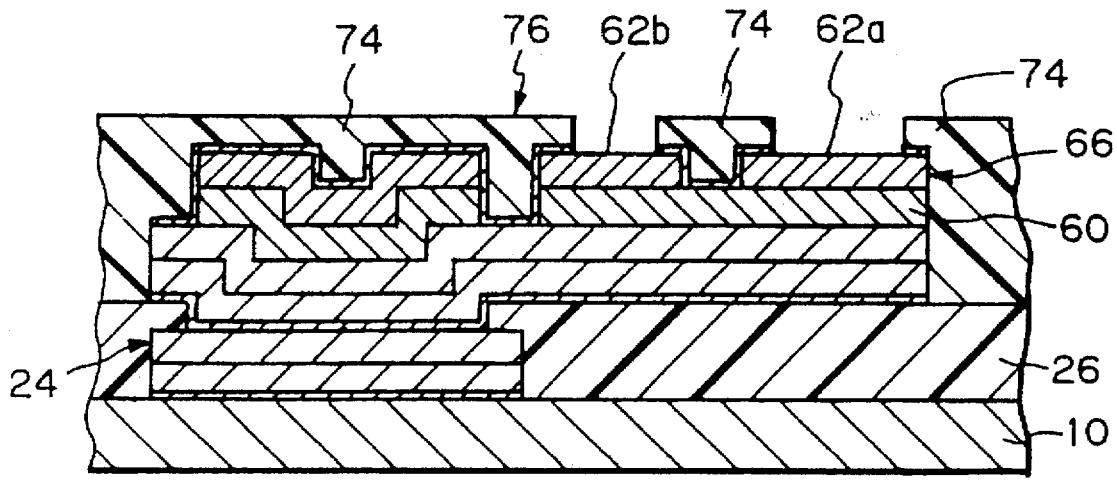

On the gold-plated layer 62 is formed a gold-etching resist 68 in a predetermined pattern as shown in FIG. 10 and, then, gold is etched. As a result, the gold-plated layer 62 is partly removed as shown in FIG. 11, and is divided into three pad layers. After, the gold-etching resist 68 is removed as shown in FIG. 12, the three gold-plated layers, which are the pad layers, serve as an electronic part-mounting pad 62a, as a remodeling pad 62b and as a connection pad 62c. Then, a chromium lift-off resist 70 is formed on the insulating layer 26 as shown in FIG. 13 in order to form a thin chromium film on the second wiring pattern layer 66 and, at this time, the chromium lift-off resist 70 is also formed on the electronic part-mounting pad 62a and on the remodeling pad 62b. After the chromium lift-off sputtering is effected, a thin chromium film 72 is formed on the second wiring pattern layer 66 and on the chromium lift-off resist 70 as shown in FIG. 14. Then, the chromium lift-off resist 70 is removed as shown in FIG. 15, and the thin chromium film 72 is left on the second wiring pattern layer 66 only. Then, as shown in FIG. 16, an overcoat insulating layer 74 composed of a polyimide resin is applied onto the insulating layer 26 and onto the second wiring pattern layer 66 while exposing the electronic part-mounting pad 62a and the remodeling pad 62b through the overcoat insulating layer 74.

When the remodeling pad 62b is used for remodeling or repairing the circuit wiring in the thus fabricated thin multi-layer circuit board, the electric connection between the remodeling pad 62b and the second wiring pattern layer can be easily cut off by a low output YAG laser or a similar laser. This is because, the nickel exclusion zone denoted by reference numeral 76, is used as a portion to be cut.

According to the first aspect of the present invention, furthermore, the nickel-plated layer 60 can be formed maintaining a thickness of not smaller than 3μand, preferably, maintaining a thickness of about 3.5μ, contributing to the corrosion resistance of the nickel-plated layer 60 when soldering lead wires to the electronic part-mounting pad 62a and to the remodeling pad 62b occurs.

FIGS. 17 to 26 illustrate an embodiment of the process for fabricating thin multi-layer circuit boards according to a second aspect of the present invention. The initial steps in this fabrication process are substantially the same as those of the fabrication process according to the first aspect of the present invention. That is, a first wiring pattern layer 24 is formed on a ceramic substrate 10, a photosensitive polyimide resin layer 26 is applied onto the first wiring patten layer 24 and after pre-baked a via hole 28 is formed, and, then, after the insulating layer 26 is cured, a thin chromium film 30 and a thin copper film 32 are formed by, for example, sputtering, and a copper-plating layer 56 is formed on the thin copper film 32 in order to form a second wiring pattern, which is the same as the fabrication process according to the first aspect of the present invention.

Figure 17:
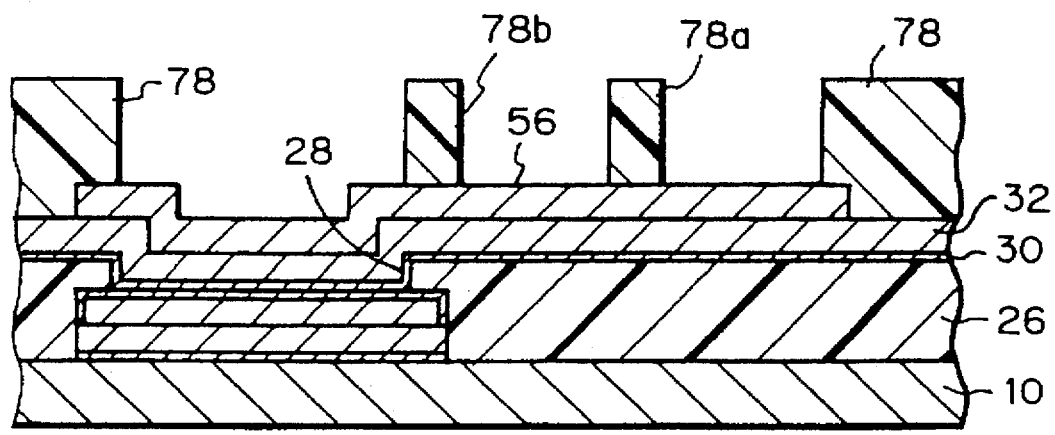
FIGS. 17 to 26 are diagrams schematically illustrating the steps in a process for fabricating thin multi-layer circuit boards according to a second aspect of the present invention.
Figure 18:
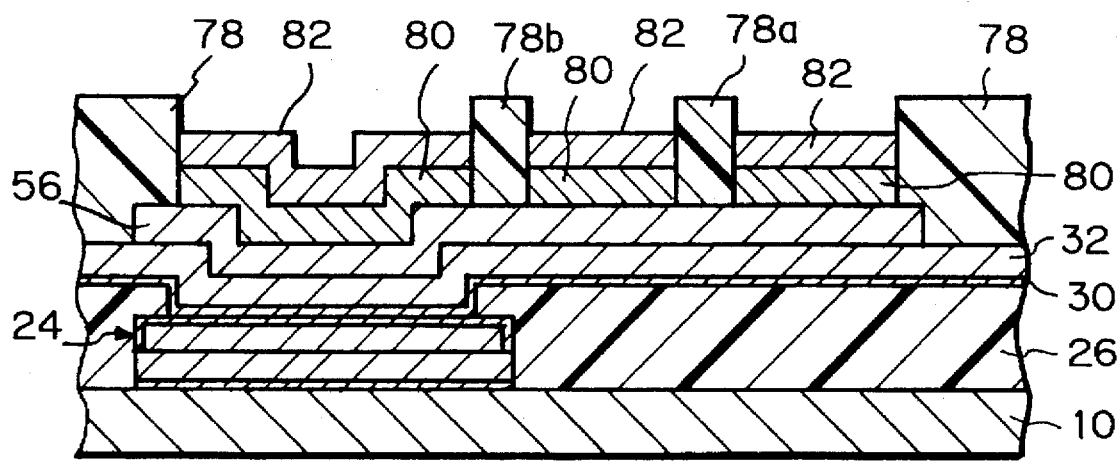
Figure 19:
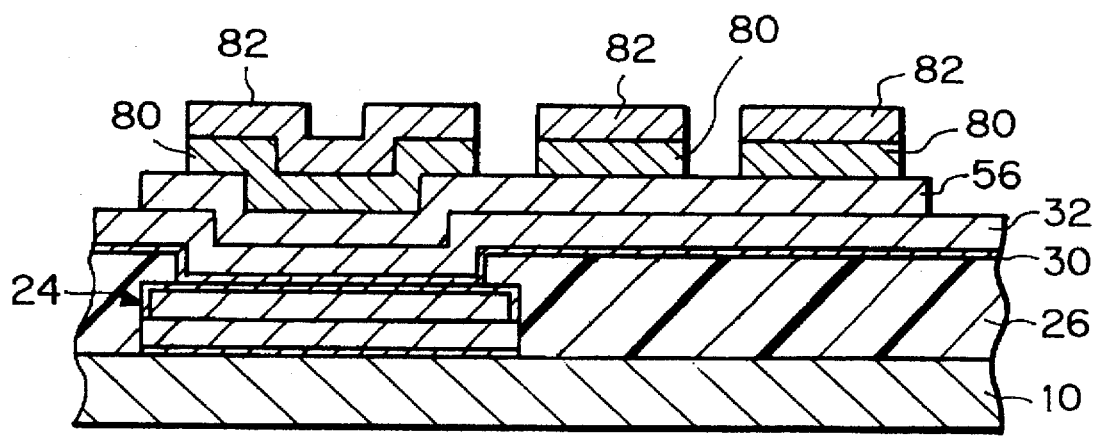

After the copper-plated layer 56 is formed, nickel and gold are further plated on the copper-plated layer 56 in the electronic part-mounting region. For this purpose, a plating resist 78 is formed around the electronic part-mounting region as shown in FIG. 17, and on the inside thereof are formed plating resists 78a and 78b on the copper-plated layer 56. After the plating resist is formed, nickel is plated to form a nickel-plated layer 80 as shown in FIG. 18 and, then, gold is plated on the nickel-plated layer 80 to form a gold-plated layer 82. Thereafter, the plating resist is removed as shown in FIG. 20.

Figure 20:
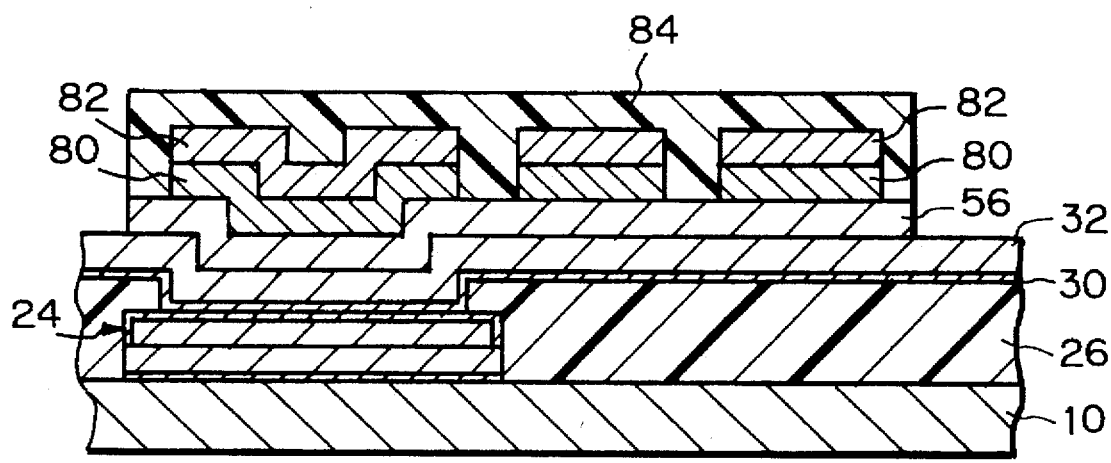
Figure 21:
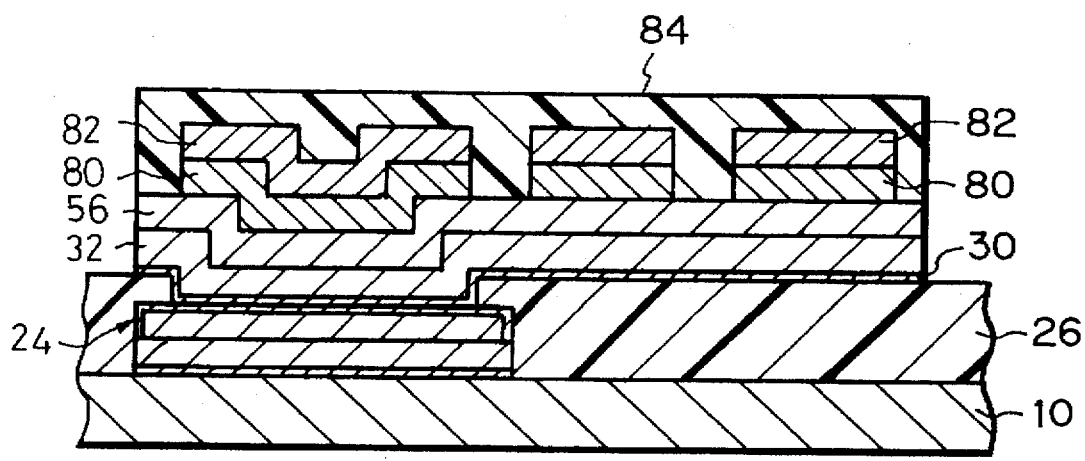
Figure 22:
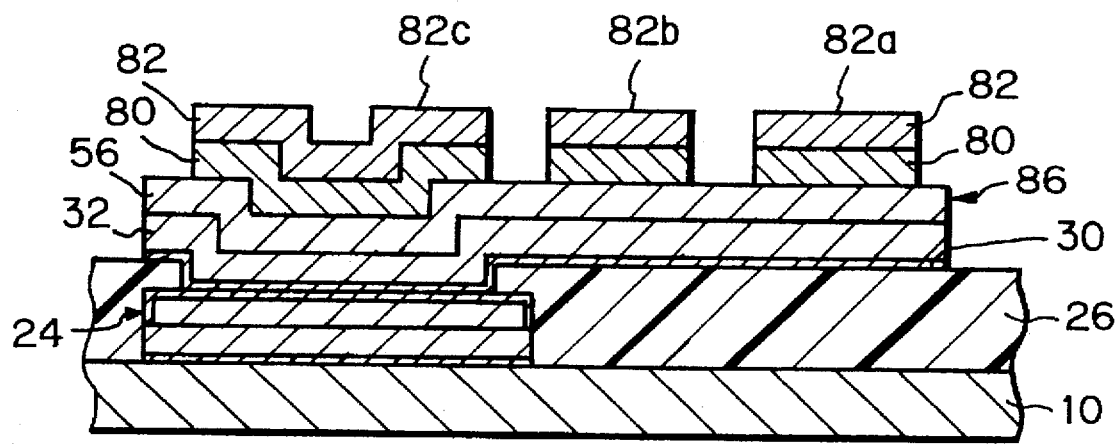

Referring to FIG. 20, after the plating resist is removed, an etching resist 84 is formed on the second wiring pattern and, then, etching is effected thereto remove the thin copper film 32 and the thin chromium film 30 from the regions other than the second wiring pattern as shown in FIG. 21. Then, the etching resist 84 is removed to obtain a second wiring pattern layer 86 on the insulating layer 26 as shown in FIG. 22. Here, it should be noted that the nickel-plated layer 80 and the gold-plated layer 82 have, respectively, been divided into three by the plating resists 78a and 78b at the time of plating, and the divided gold-plated layer serves as the electronic part-mounting pad 82a, as the remodeling pad 82b and as the connection pad 82c, eliminating the need of etching the gold-plated layer 80.

Figure 23:
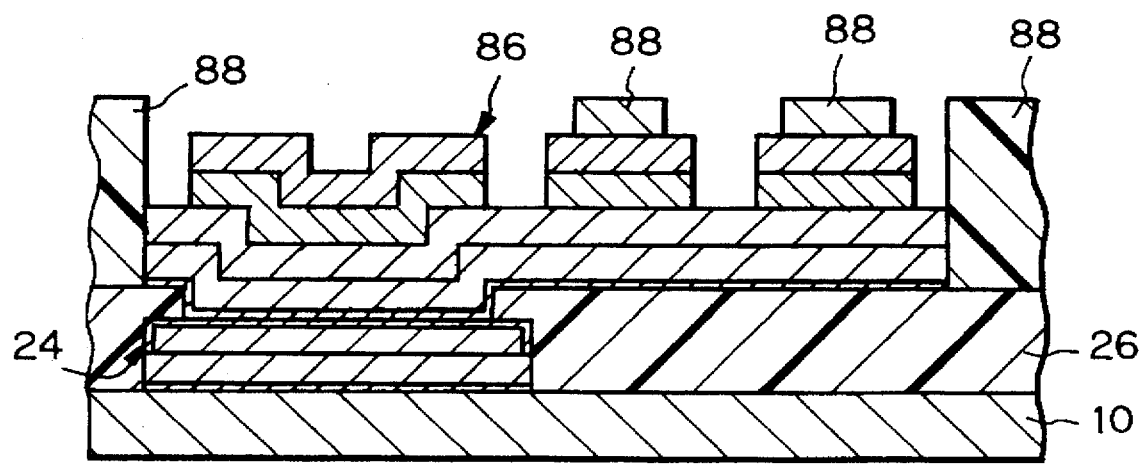
Figure 24:
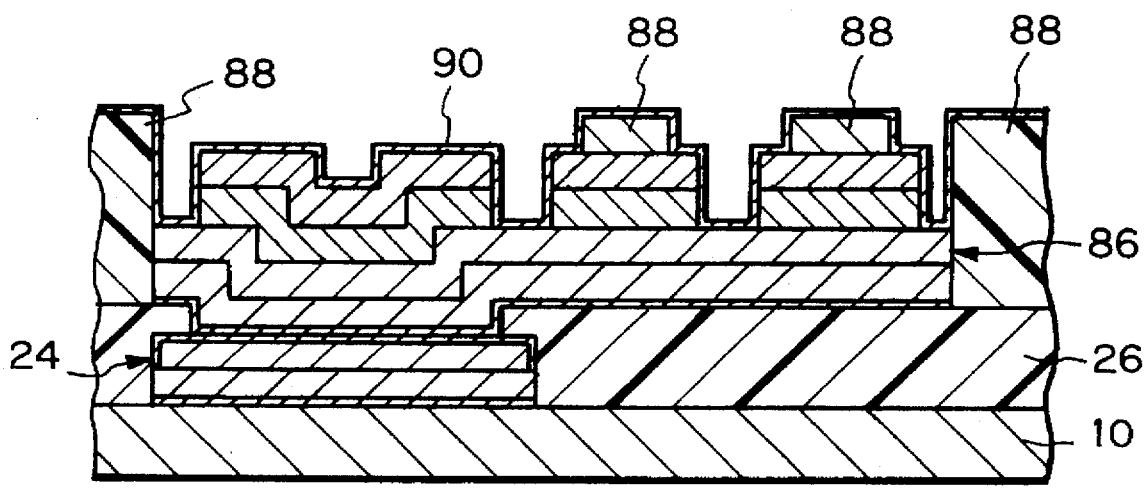
Figure 25:
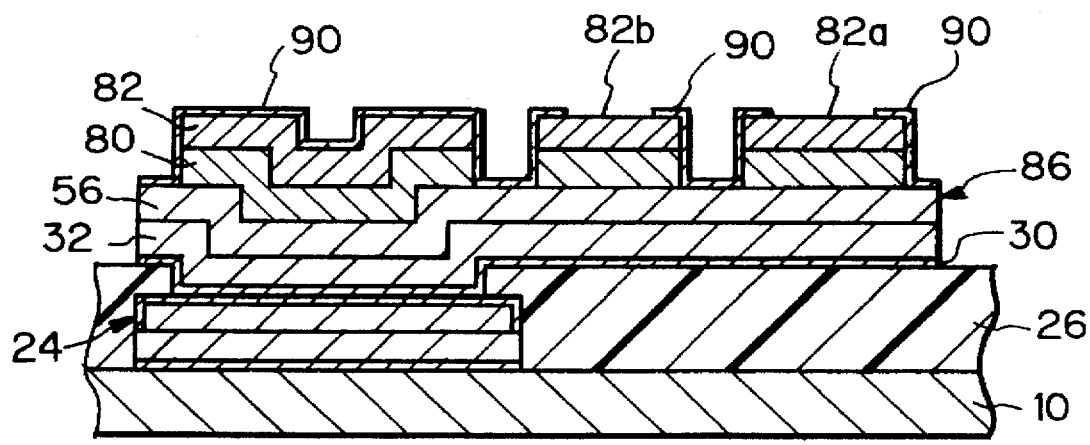
Figure 26:
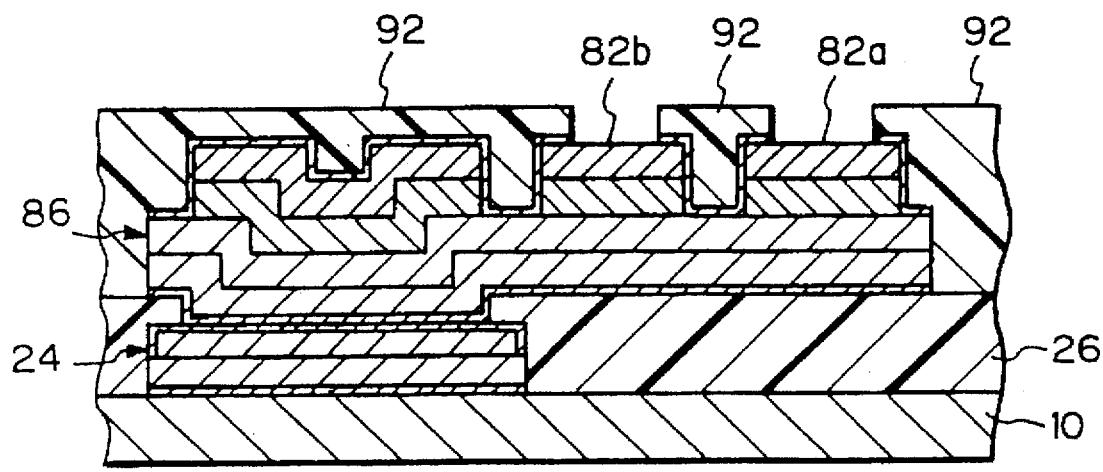

Thereafter, a chromium lift-off resist 88 is formed on the insulating layer 26, as shown in FIG. 23 to form a thin chromium layer on the second wiring pattern layer 86 and, at this time, the chromium lift-off resist 88 is also formed on the electronic part-mounting pad 82a and on the remodeling pad 82b. After chromium lift-off sputtering is effected, a thin chromium film 90 is formed on the second wiring pattern layer 86 and on the chromium lift-off resist 88 as shown in FIG. 24. Then, as the chromium lift-off resist 88 is removed as shown in FIG. 25, the thin chromium film 90 is left on the second wiring pattern layer 86 only. Thereafter as shown in FIG. 26, an overcoat insulating layer 92 composed of a polyimide resin is applied onto the insulating layer 26 and onto the second wiring pattern layer 86 while the electronic part-mounting pad 82a and the remodeling pad 82b are exposed through the overcoat insulating layer 92.

The aforementioned fabrication process has a feature in that there is no need to effect the etching for the gold-plated layer 82 and, hence, the use of a highly toxic etching solution can be avoided. According to this embodiment, furthermore, the remodeling pad 82b is disposed neighboring the nickel exclusion region and, hence, the electrical connection between the remodeling pad 62b and the second wiring pattern layer 86 can be easily cut by a low output YAG laser or the like at the time of remodeling or repairing the circuit wiring as in first aspect of the present invention. In the fabrication method according to the second aspect of the present invention, i.e., in the fabrication which excludes the gold-etching processing, however, the nickel-plated layer 80 may be extended without being divided. In this case, after the nickel-plated layer is formed in an extending manner, plating resists (78a, 78b) as shown in FIG. 17 are formed on the nickel-plated layer in the electronic part-mounting region.

FIGS. 27 to 36 illustrate an embodiment of the process for fabricating thin multi-layer circuit boards according to a third aspect of the present invention. The initial steps in this fabrication process are substantially the same as those of the fabrication process according to the first aspect of the present invention. That is, a first wiring pattern layer 24 is formed on a ceramic substrate 10, a photosensitive polyimide resin layer 26 is applied onto the first wiring pattern layer 24 and is pre-baked to form a via hole 28, and, then, after the insulating layer 26 is cured, a thin chromium film 30 and a thin copper film 32 are formed by, for example, sputtering, and a copper-plating layer 56 is formed on the thin copper film 32 in order to form a second wiring pattern, which are the same as in the fabrication process according to the first aspect of the present invention.

Figure 27:
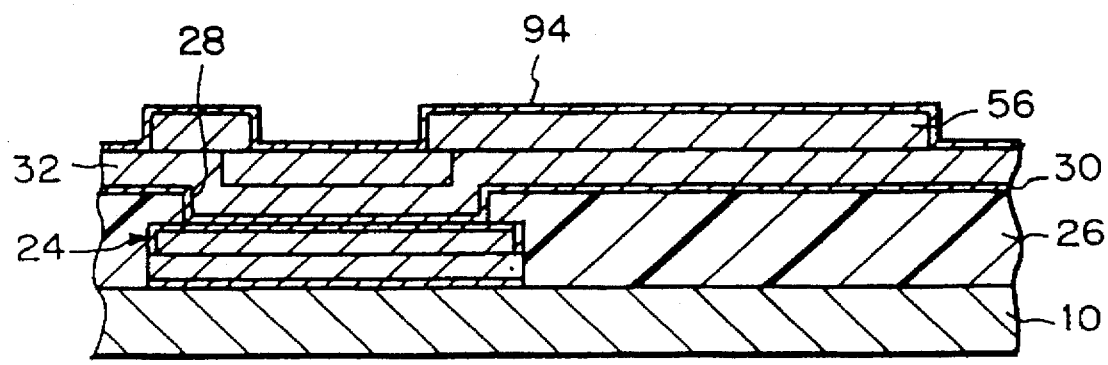
FIGS. 27 to 35 are diagrams schematically illustrating the steps in a process for fabricating thin multi-layer circuit boards according to a third aspect of the present invention.
Figure 28:
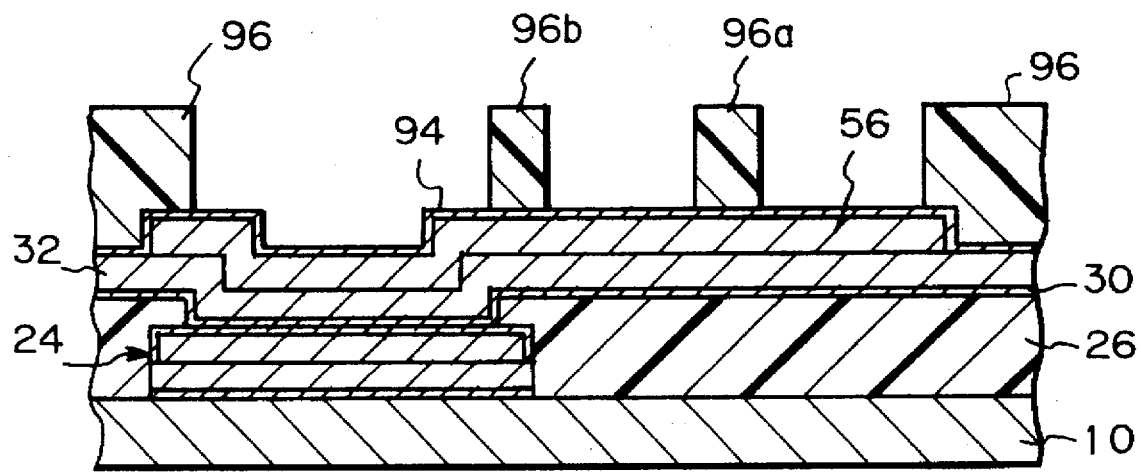
Figure 29:
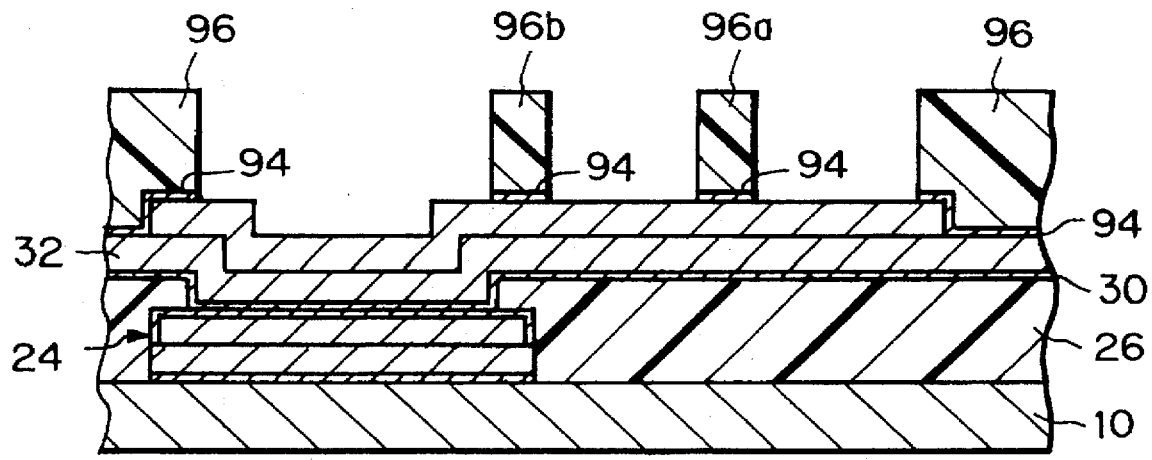
Figure 30:
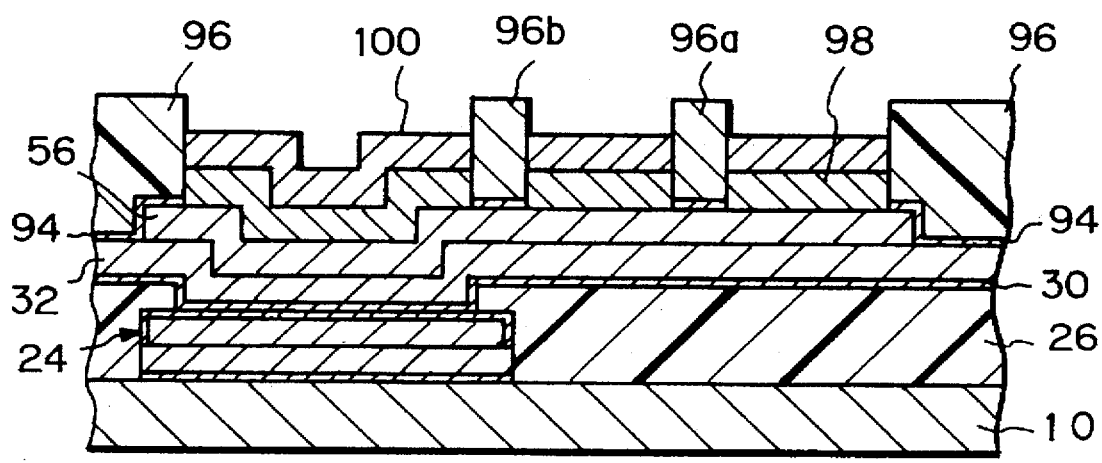
Figure 31:
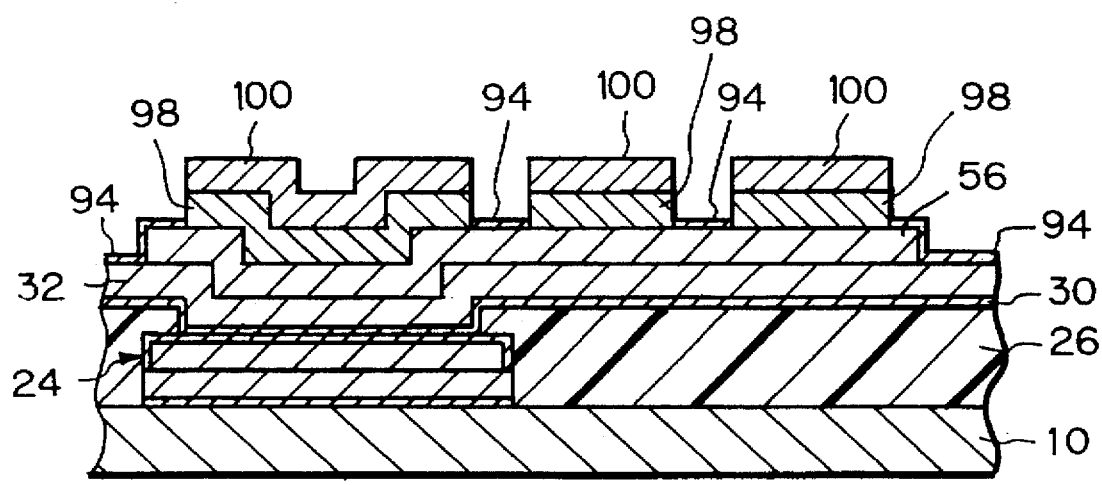

After the copper-plated layer 56 is formed as shown in FIG. 27, a thin chromium film 94 is formed by, for example, sputtering on the thin copper film 32 and on the copper-plated layer 56. After the thin chromium film 94 is formed, a resist 96 is formed around the electronic part-mounting region as shown in FIG. 28 and, besides, resists 96a and 96b are formed on the thin chromium film 94 on the inside of the electronic part-mounting region. After the resist is formed, the etching is effected to remove the thin chromium film 94 from the electronic part-mounting region as shown in FIG. 29. Then, in the electronic part-mounting region, a nickel-plated layer 98 is formed as shown in FIG. 30. Thereafter, a gold-plated layer 100 is formed by plating gold on the nickel-plated layer 98 and, then, plating resists 96, 96a and 96b are removed as shown in FIG. 31.

Figure 32:
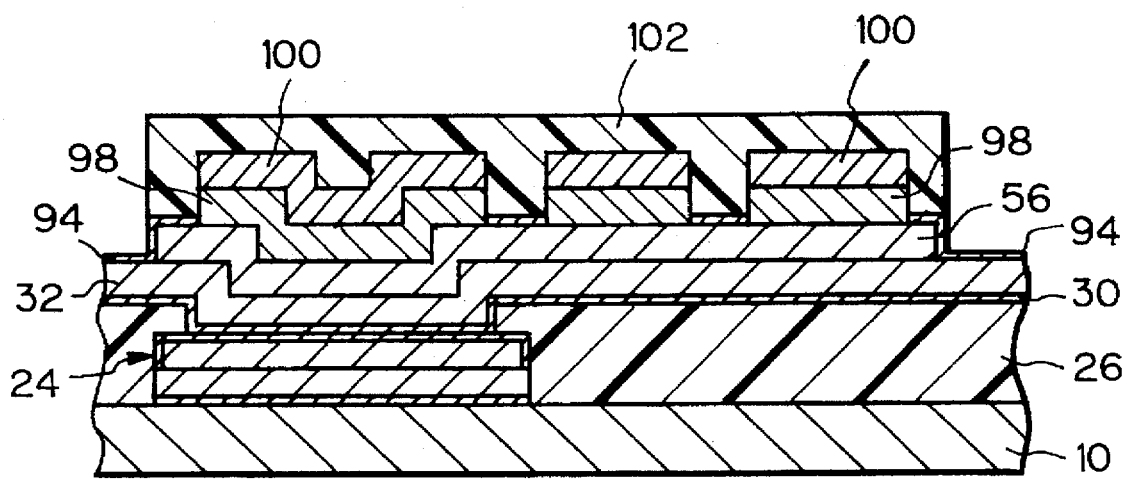
Figure 33:
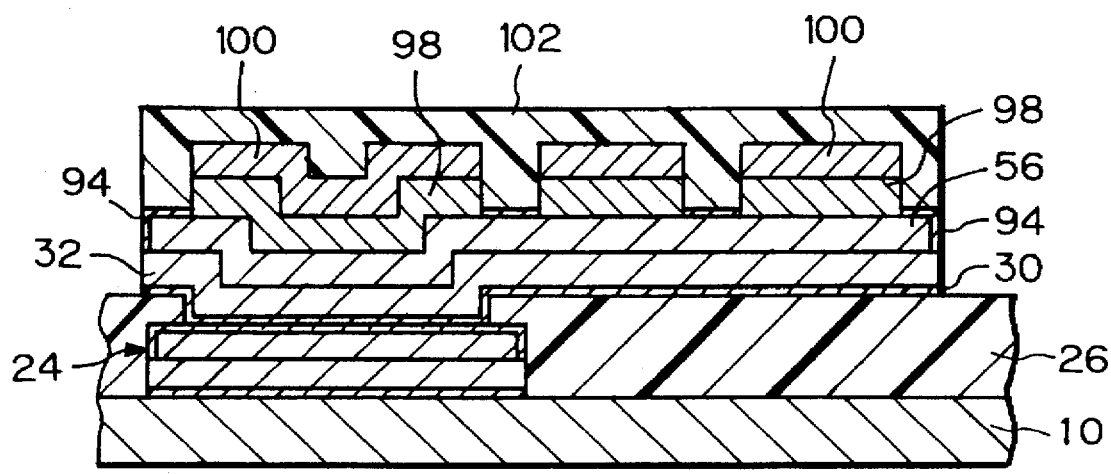
Figure 34:
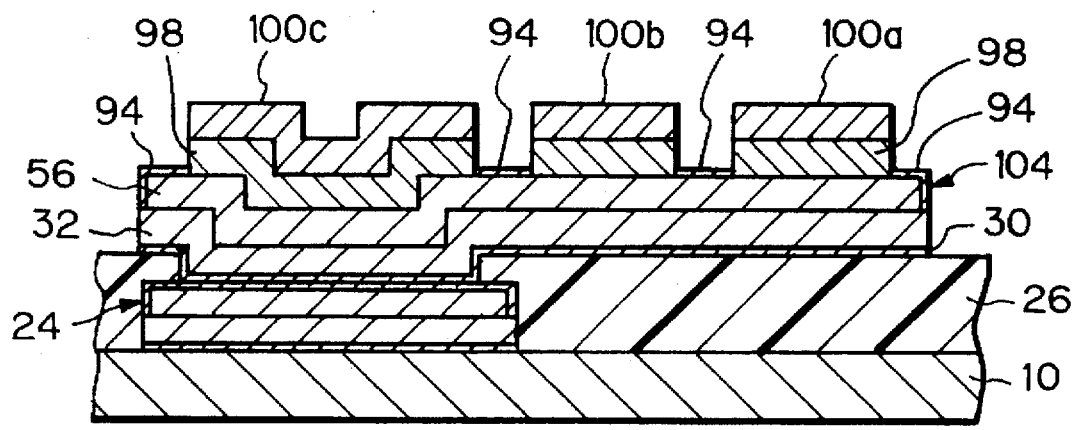
Figure 35:
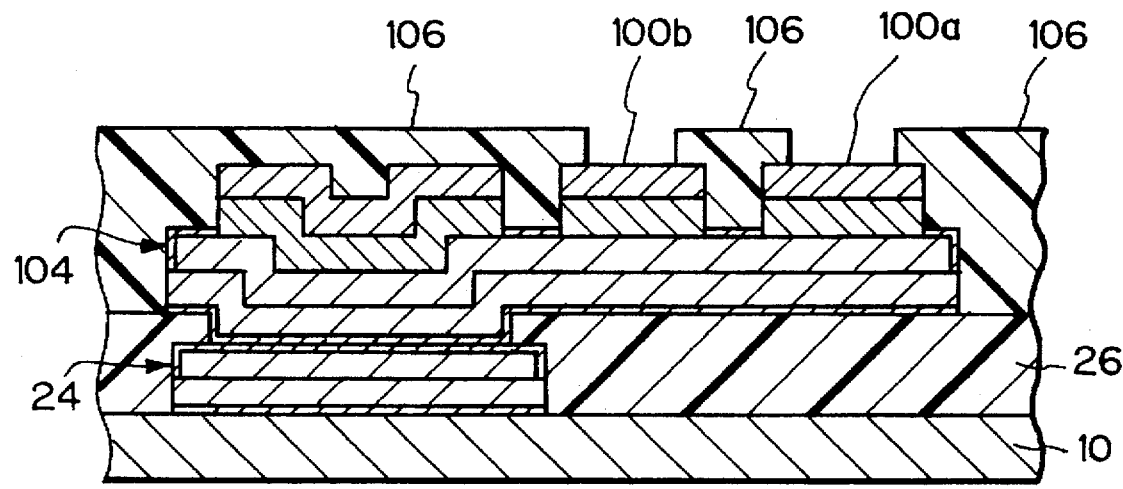

After the plating resists are removed, an etching resist 102 is formed on the second wiring pattern as shown in FIG. 32. By effecting the etching thereto, the thin chromium film 94, the thin copper film 32 and the thin chromium film 30 are removed from the regions other than the second wiring pattern as shown in FIG. 33. Thereafter, the etching resist 102 is removed to obtain a second wiring pattern layer 104 on the insulating layer 26 as shown in FIG. 34. As the case of the embodiment (FIGS. 17 to 26) according to the second aspect of the present invention, the nickel-plated layer 98 and the gold-plated layer 100 are, respectively, divided into three by the plating resists 96a and 96b at the time of plating, and the divided gold-plated layers serve as an electronic part-mounting pad 100a, as a remodeling pad 100b and as a connection pad 100c, eliminating the need of effecting the etching for the gold-plated layer 100. Then, as shown in FIG. 35, an overcoat insulating layer 106 composed of a polyimide resin is applied onto the insulating layer 26 and onto the second wiring pattern layer 104 while exposing the electronic part-mounting pad 100a and the remodeling pad 100b through the overcoat insulating layer 92.

The aforementioned fabrication process has a novel feature in that the thin chromium film 94 is formed on the second wiring pattern layer 104 formed on the insulating layer 26 without relying upon the lift-off method. This embodiment has not only the feature according to the first aspect of the present invention in that the electrical connection between the remodeling pad 100b and the second wiring pattern layer 104 is easily cut by a low output YAG laser or the like at the time of remodeling or repairing the circuit wiring but also the feature, according to the second aspect of the present invention, that there is no need to etch the gold-plated layer 100. In addition, it should be understood that the feature according to the third aspect of the present invention, i.e., forming the thin chromium film on the insulating layer without relying upon the lift-off method, by itself constitutes an invention.

Figure 36:
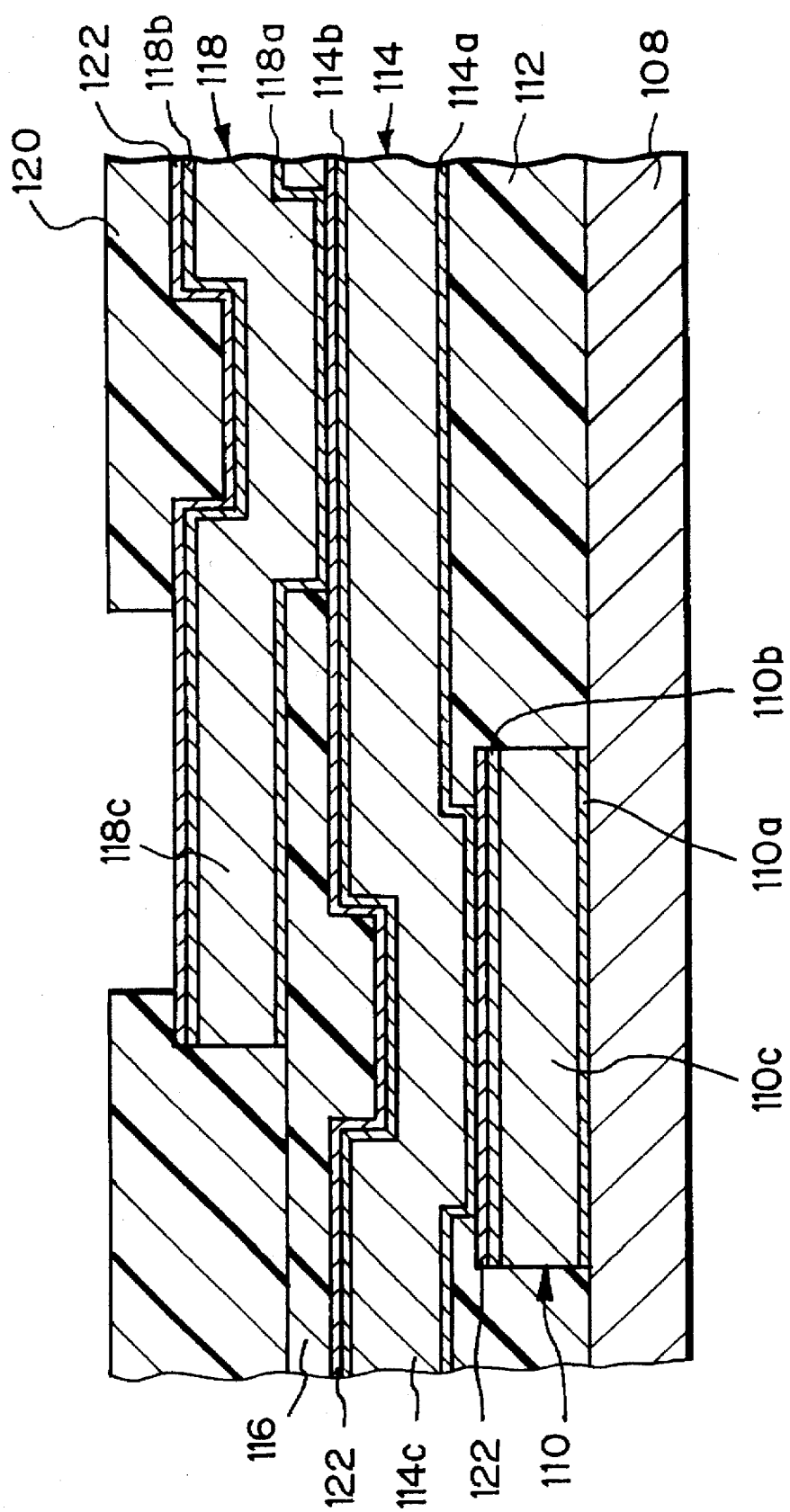
FIG. 36 is a diagram schematically illustrating a step in a process for fabricating thin multi-layer circuit boards according to a fourth aspect of the present invention.

FIG. 36 illustrates, in the form of an intermediate product, a thin multi-layer circuit board fabricated by the process for fabrication according to a fourth aspect of the present invention. This intermediate product is in a stage in which wiring pattern layers and polyimide resin layers are alternately stacked on a ceramic substrate 108. That is, on the ceramic substrate 108 is formed a first wiring pattern layer 110 which is covered with a first polyimide resin insulating layer 112. On the first polyimide resin insulating layer 112 is formed a second wiring pattern layer 114 which is covered with a second polyimide resin insulating layer 116. On the second polyimide resin insulating layer 116 is formed a third wiring pattern layer 118 which is covered with a third polyimide resin insulating layer 120. The first to third wiring pattern layers 110, 114 and 118 are connected together through vias formed in the polyimide resin insulating layers 112, 116 and 120, thereby to constitute a predetermined circuit pattern. The wiring patterns 110, 114 and 118, respectively, include thin chromium films 110a; 110b, 114a; 114b, 118a; 118b, as well as copper layers 110c, 114c and 118c formed among the thin chromium films. The wiring pattern layers 110, 114, 118 and the polyimide resin insulating layers 112, 116, 118 can be formed through a variety of processes mentioned already.

Figure 37:
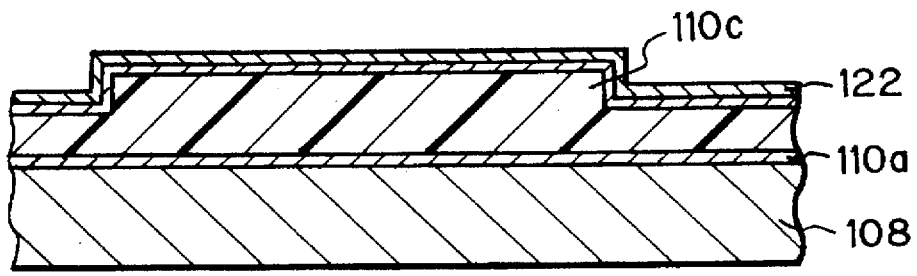
FIGS. 37 to 39 are diagrams schematically illustrating the steps in a process for applying a metallic barrier film onto a wiring pattern layer in the thin multi-layer circuit substrate shown in FIG. 36.
Figure 38:
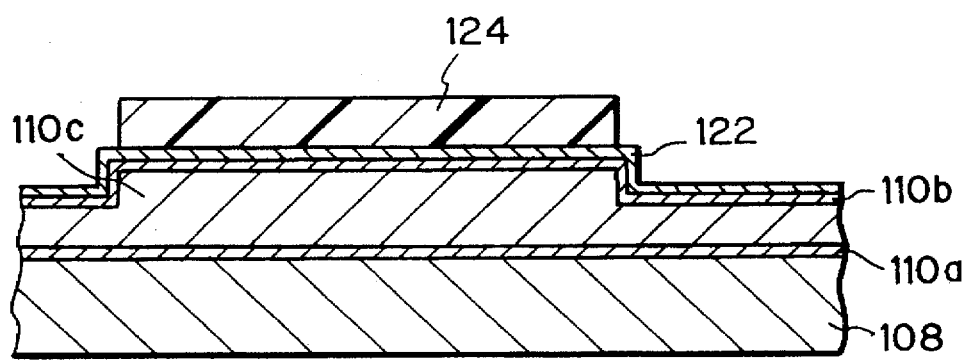
Figure 39:
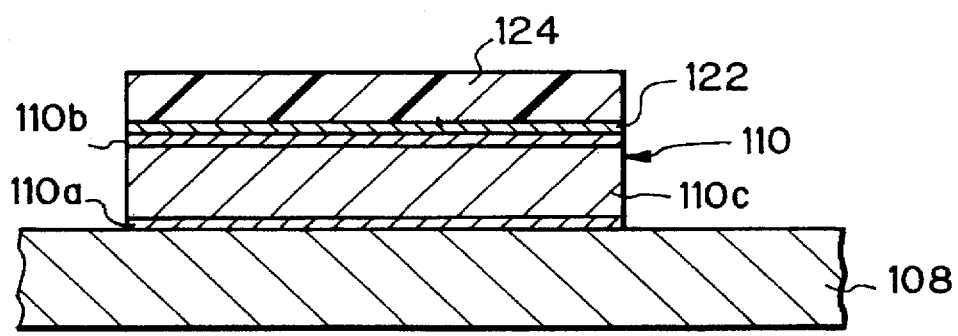

In this embodiment, the thin chromium films 110b, 114b and 118b are covered with a metallic barrier film 122 every time the wiring pattern layers 110, 114 and 118 are formed, the metallic barrier film 122 being comprised of, for example, titanium nitride, platinum or the like. The metallic barrier film 122 can be incorporated at the time of forming the wiring pattern layers 110, 114 and 118 relying, for example, upon the etching as shown in FIGS. 37 to 39. Referring to FIG. 37, a first thin chromium film 110a is, first, formed by sputtering on the ceramic substrate 108 and, then, copper is sputtered thereon. Next, a copper layer 110c is formed by playing copper on a region that corresponds to the first wiring pattern, then, a second thin chromium film 110b is formed by sputtering and a metallic barrier film 122 is formed thereon by sputtering. Referring next to FIG. 38, an etching resist 124 is formed on a predetermined region and the etching is effected to obtain a first wiring pattern layer 110 as shown in FIG. 39. The metallic barrier film 122 of titanium nitride or platinum is very stable against an etching solution for chromium or copper. When the metallic barrier film 122 is composed of titanium nitride, therefore, the etching solution will comprise concentrated hydrofluoric acid, concentrated nitric acid and water. When the metallic barrier film 122 is composed of platinum, the etching solution will be aqua regia or a diluted aqua regia solution.

Figure 40:
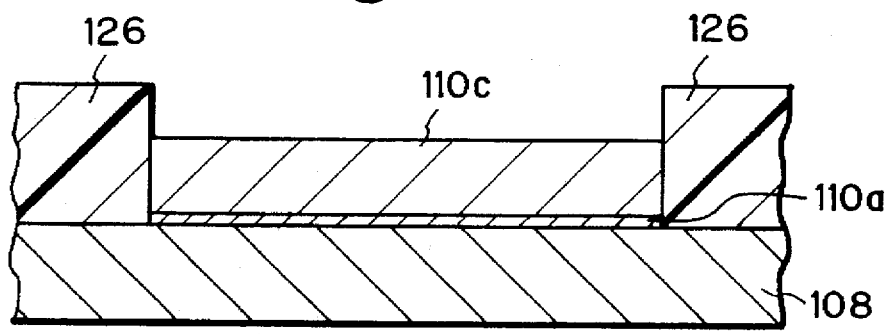
FIGS. 40 to 42 are diagrams schematically illustrating the steps in another process for applying a metallic barrier film onto a wiring pattern layer in the thin multi-layer circuit substrate shown in FIG. 36.
Figure 41:
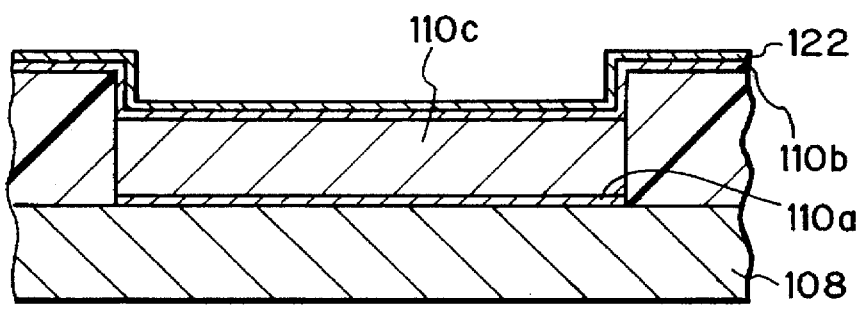
Figure 42:
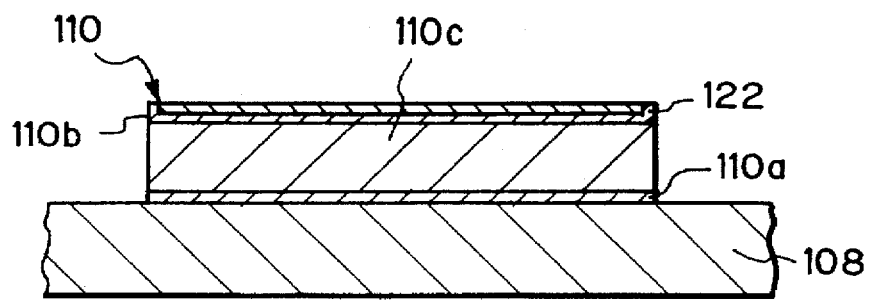

As shown in FIGS. 40 to 42, furthermore, the metallic barrier film can also be formed by the lift-off method. That is, a first thin chromium film 110a is formed by sputtering on the ceramic substrate 108 and, then, copper is sputtered thereon. Next, a copper layer 110c is formed by plating copper on a region corresponding to the first wiring pattern, and the first thin chromium film 110a and the copper layer 110c are formed into a predetermined wiring pattern by etching. Then, a lift-off resist 126 is formed thereon as shown in FIG. 40. Referring next to FIG. 42, a thin chromium film 110b and a metallic barrier film 122 are formed by sputtering. Then, the lift-off resist 126 is removed to obtain a first wiring pattern layer 110 on the ceramic substrate 120.

In the process for fabrication according to the fourth aspect of the present invention, a defective wiring pattern layer that is formed in the step of alternately stacking the wiring pattern layers and the polyimide resin insulating layers, can be formed again. For instance, in case a defect is found after the third wiring pattern layer 118 is formed, the third wiring pattern layer 118 is removed without at all damaging the second wiring pattern layer 116. In detail, the metallic barrier film 122 of the third wiring pattern layer 118 is removed by using the above-mentioned etching solution and, then, the second thin chromium film 118b, copper layer 118c and first thin chromium film 118a are removed by using a known etching solution. In this case, the second wiring pattern layer 114 has been covered with the metallic barrier film 122, and the etching solution for chromium and copper does not permeate into the second wiring pattern layer 114 through the via. Accordingly, the third wiring pattern layer 118 that has been removed can be formed again.

In the embodiment according to the fourth aspect of the present invention, the metallic barrier film 122 covers the second thin chromium films 110b, 114b and 118b of the wiring pattern layers 110, 114 and 118. As required, the metallic barrier film 122 may be formed between the copper layers 110c, 114b, 118b and the second thin chromium films 110b, 114b, 118b. In this case, the second thin chromium films 110b, 114b and 118b may be damaged at the time of removing the defecting wiring pattern layer, but the damage does not extend to the copper layers 110c, 114b and 118b. By strictly managing the etching time, furthermore, damage to the second thin chromium films can be minimized.

In the process for fabricating thin multi-layer circuit boards as described above, the photosensitive polyimide resin is used not only as an insulating material but also as a resist material. When the polyimide resin is applied, the ceramic substrate is put into the oven and is pre-baked. It was mentioned already that in this case, the ceramic substrate is uniformly heated from the back side thereof. A fifth aspect of the present invention is directed to improving the pre-baking method.

Figure 43:
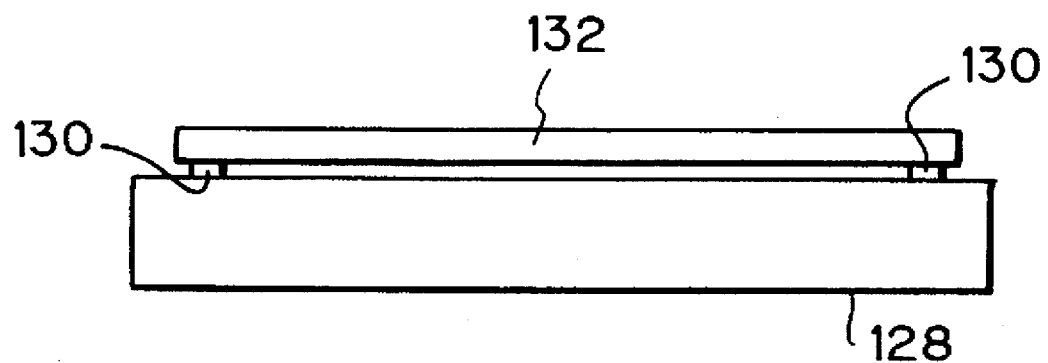
FIG. 43 is a diagram which schematically illustrates the principle of a pre-baking method according to a fifth aspect of the present invention.
Figure 44:
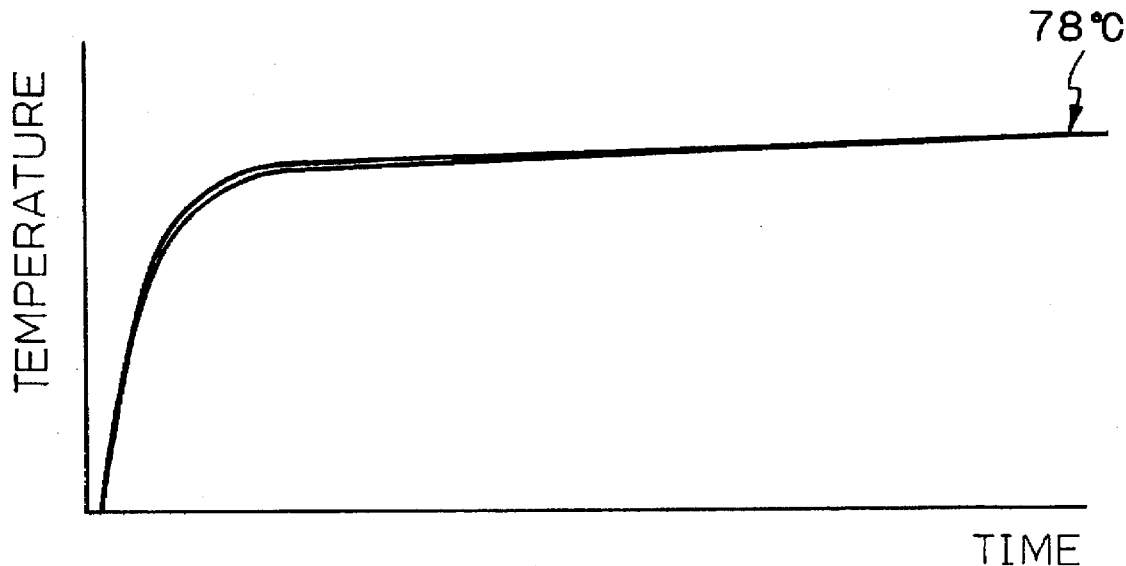
FIG. 44 is a graph showing the distribution of temperature rise of when a ceramic substrate is heated by the pre-baking method shown in FIG. 43.
Figure 45:
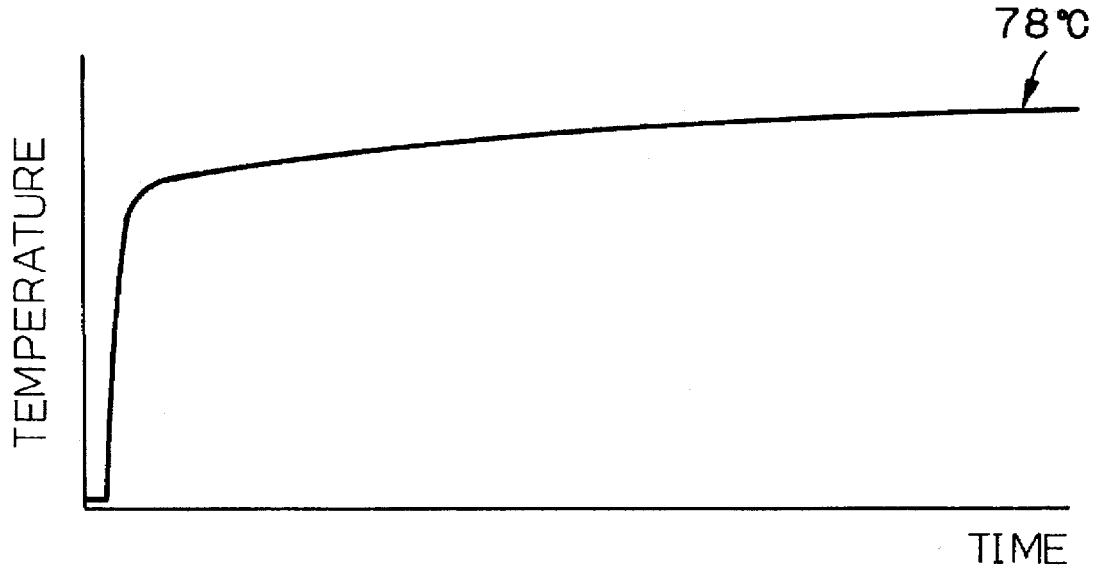
FIG. 45 is a graph showing the distribution of temperature rise of when a ceramic substrate is heated by a pre-baking method which is different from the pre-baking method shown in FIG. 43.

FIG. 43 illustrates the principle of the pre-baking method according to the fifth aspect of the present invention, wherein reference numeral 128 denotes a heat-accumulating block which is made of, for example, aluminum. The heat-accumulating block 128 is left to stand in an oven (not shown) having an atmospheric temperature of, for example, about 80°. The heat-accumulating block 128 has a flat upper surface, and a pair of copper strips 130 are disposed along the opposing side edges on the surface thereof. A ceramic substrate 132 coated with the polyimide resin is placed on the pair of copper strips 130, and a gap of about 0.3 mm is maintained between the upper surface of the heat-accumulating block 128 and the ceramic substrate 132. Therefore, the ceramic substrate 132 is gradually heated from the back side thereof by receiving radiant heat. At this moment, the rise in the temperature is measured at five points at equal distances along the diagonal of the ceramic substrate 132. The results are shown in a graph of FIG. 44 from which it will be obvious that the temperature rises are nearly the same at all of the above-mentioned five points. FIG. 45 illustrates similar temperature rises in the case when the ceramic substrate 132 is placed on the upper surface of the heat-accumulating block. It can be regarded that the temperature rise is substantially the same at five points maintaining an equal distance along the diagonal lines of the ceramic substrate 132. That is, it is desired to place the ceramic substrate 132 directly on the upper surface of the heat-accumulating block in order to uniformly heat the ceramic substrate 132. As mentioned earlier, however, it is not possible to place the ceramic substrate 132 directly on the heat-accumulating block 128.

Figure 46:
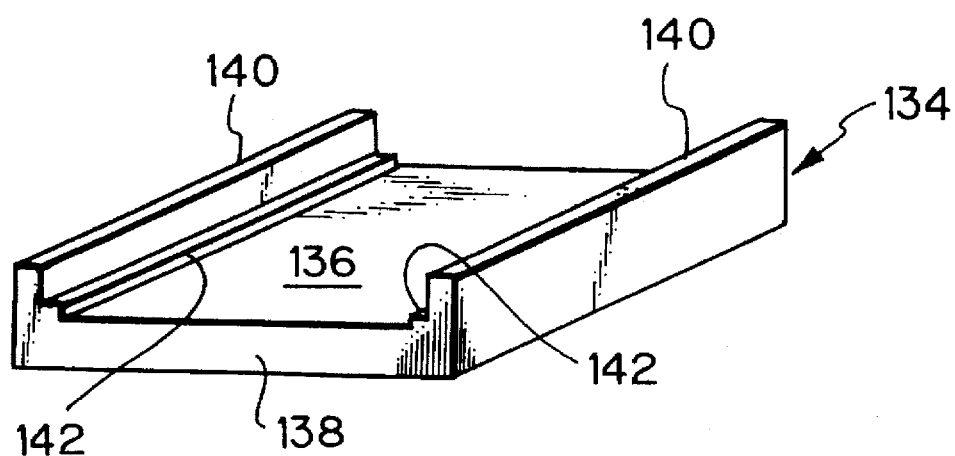
FIG. 46 is a perspective view of a heat-accumulating block that is suited for putting into practice the pre-baking method according to the fifth aspect of the present invention.
Figure 47:
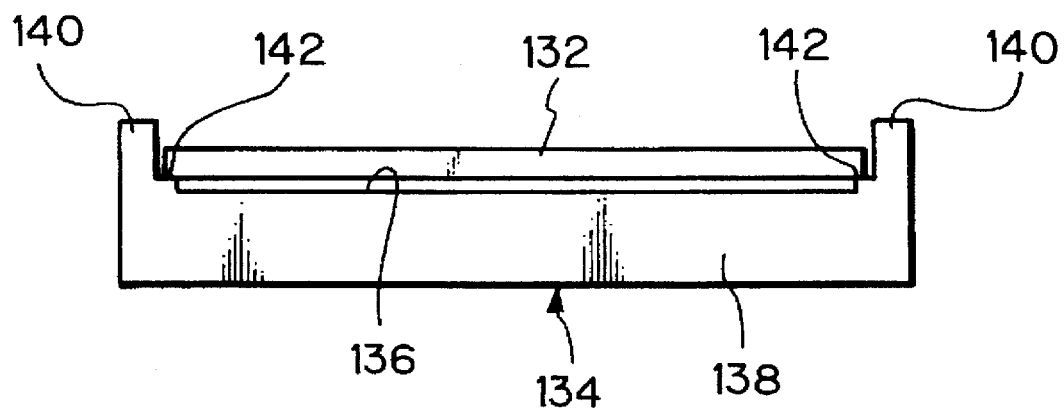
FIG. 47 is a diagram illustrating an end surface of the heat-accumulating block.

FIGS. 46 and 47 illustrate a heat-accumulating block 134 adapted to putting the pre-baking method of the present invention into practice. The heat-accumulating block 134 comprises a block member 138 having a flat heating surface 136, a pair of guide walls 140 that extend in parallel along the opposing sides of the heating surface 136 of the block member 138, and rail elements 142 that extend along the corners formed by the guide walls 140 and the heating surface 136. The lateral width of the pair of guide wall portions 140 is slightly broader than the distance between the opposing side edges of the insulating plate-like substrate. With this constitution, the ceramic substrate 132 is placed on the rail elements 142 from the ends on one side of the pair of guide walls 140, and is pushed; i.e., the ceramic substrate 132 can be easily moved on the flat surface 136 of the heat-accumulating block 134 and can be easily pulled out along the rail elements 142. Even when a plurality of heat-accumulating blocks 134 are arranged in a plurality of stages to be stacked in the up-and-down direction in the oven, the ceramic substrates can be easily put into, and taken out from, the heat-accumulating blocks 134, enabling the pre-baking processing to be quickly executed.

Figure 48:
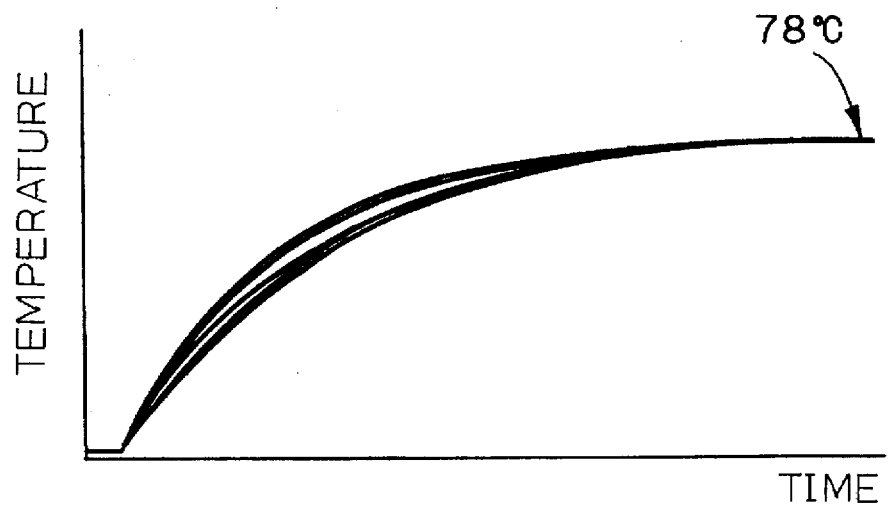
FIG. 48 is a graph showing the distribution of temperature rise of when a ceramic substrate is heated by using the heat-accumulating blocks of FIGS. 46 and 47.

FIG. 48 is a graph showing the results of the measurement of the temperature rise distribution in the manner described above in the case when the ceramic substrate 132 is heated by being placed on the heat-accumulating block 134. It will be obvious from this graph that the ceramic substrate 132 is heated substantially uniformly though the temperature rise distribution is slightly disturbed immediately after the start of the heating.

We claim:

1. A process for fabricating thin multi-layer circuit boards, comprising:
    alternately stacking wiring pattern layers and insulating layers on an insulating plate-like substrate;
    electrically interconnecting said wiring pattern layers through aligned vias in said insulating layers in order to construct a circuit pattern of said wiring pattern layers;
    exposing a portion of a top wiring pattern layer of said wiring pattern layers;
    forming a metallic barrier layer partially covering said exposed portion of said top wiring pattern layer, said metallic barrier layer having an electronic part-mounting region and a barrier metal exclusion zone, said barrier metal exclusion zone being a part of said metallic barrier layer which does not cover said exposed portion of said top wiring pattern layer;
    forming a remodelling pad layer on said metallic barrier layer in a location neighboring said barrier metal exclusion zone; and
    forming an electronic part-mounting pad layer in a location neighboring said remodeling pad layer.

2. A process for fabrication according to claim 1, wherein the process of forming said metallic barrier layer having said barrier metal exclusion zone further comprises: forming a plating resist in a configuration on a lower wiring pattern layer of said wiring pattern layers at a position corresponding to said barrier metal exclusion zone; and
    plating nickel onto said lower wiring pattern layer, the plating resist layer preventing the formation of nickel in the barrier metal exclusion zone.

3. A process according to claim 1, further comprising:
    forming the metallic barrier layer such that the barrier metal exclusion zone is at a first location, between the aligned vias in said insulating layers and a second location of the remodelling pad layer.

4. A process as recited in claim 3, further comprising forming the electronic part-mounting pad layer at a third location, with the second location between the first and third locations.

5. A process for fabricating thin multi-layer circuit boards, comprising:
    stacking wiring pattern layers and insulating layers, in alternating succession, on an insulating plate-like substrate;
    electrically interconnecting said wiring pattern layers through vias in said insulating layers in order to construct a circuit pattern of said wiring pattern layers; and
    forming a corresponding metallic barrier film on, and partially covering, each wiring pattern layer after forming the wiring pattern layer and preceding the forming of a successive, stacked insulating layer.

6. A fabrication process according to claim 5, further comprising:
    forming said metallic barrier film by etching.

7. A fabrication process according to claim 5, further comprising:
    forming each wiring pattern layer by forming a thin chromium film and then forming a copper layer on said thin chromium film; and
    forming the metallic barrier film on, and so as to cover, said copper layer of the wiring pattern layer.

8. A process according to claim 5, further comprising:
    forming said metallic barrier layer such that a barrier metal exclusion zone is at a first location, between the aligned vias in said insulating layers and a second location of the remodelling pad layer, wherein said barrier metal exclusion zone is a part of said metallic barrier layer which does not cover said exposed portion of said wiring pattern layer.

9. A process as recited in claim 8, further comprising forming the electronic part-mounting pad layer at a third location, with the second location between the first and third locations.

10. A process for fabricating thin multi-layer circuit boards, comprising:
    alternately stacking wiring pattern layers (24, 104) and insulating layers (26, 106) on an insulating plate-like substrate;
    electrically interconnecting said wiring pattern layers through vias in said insulating layers in order to construct a circuit pattern of said wiring pattern layers;
    exposing a portion of a wiring pattern layer of said wiring pattern layers;
    forming a metallic barrier partially covering said exposed portion of said wiring pattern layer in an electronic part-mounting region;
    forming a pad-defining resist layer on said metallic barrier layer.

11. A process according to claim 10, further comprising:

forming said metallic barrier layer such that a barrier metal exclusion zone is at a first location, between the aligned vias in said insulating layers and a second location of the remodelling pad layer, wherein said barrier metal exclusion zone is a part of said metallic barrier layer which does not cover said exposed portion of said wiring pattern layer.

12. A process as recited in claim 11, further comprising forming the electronic part-mounting pad layer at a third location, with the second location between the first and third locations.

13. A process for fabricating thin multi-layer circuit boards, comprising:

alternately stacking wiring pattern layers and insulating layers on an insulating plate-like substrate;

electrically interconnecting said wiring pattern layers through vias in said insulating layers in order to construct a circuit pattern of said wiring pattern layers, wherein forming a pad-defining resist layer on the wiring pattern layer in an electronic part-mounting region;

forming a metallic barrier layer on the wiring pattern layer except in those locations thereof covered by the pad-defining resist layer;

forming a gold pad layer, comprising gold pads of a number and each of a shape as defined by the pad-defining resist layer, on the metallic barrier layer; and removing said pad-defining resist layer.

14. A process according to claim 13, further comprising:

forming said metallic barrier layer such that a barrier metal exclusion zone is at a first location, between the aligned vias in said insulating layers and a second location of the remodelling pay layer, wherein said barrier metal exclusion zone exists at said locations thereof covered said pad-defining resist layer.

15. A process as recited in claim 14, further comprising forming the electronic part-mounting pad layer at a third location, with the second location between the first and third locations.

16. A process for fabricating thin multi-layer circuit boards, comprising:

alternately stacking wiring pattern layers and insulating layers on an insulating plate-like substrate;

electrically interconnecting said wiring pattern layers through vias in said insulting layers in order to construct a circuit pattern of said wiring pattern layers;

each writing pattern layer being formed by sequentially forming a first thin chromium film, a cooper layer and a second thin chromium film, and etching the thus-formed first thin chromium film, cooper layer, and second thin chromium film, thereby to produce a desired configuration each wiring pattern layer; and forming a metallic barrier layer partially covering each wiring pattern layer.

17. A process according to claim 16, further comprising:

forming said metallic barrier layer such that a barrier metal exclusion zone is at a first location, between the aligned vias in said insulating layers and a second location of the remodelling pad layer, wherein said barrier metal exclusion zone is a part of said metallic barrier layer which does not cover said exposed portion of said writing pattern layer.

18. A process as recited in claim 17, further comprising forming the electronic part-mounting pad layer at a third location, with the second location between the first and third locations.

19. A process for fabricating thin multi-layer circuit boards, comprising:

alternately stacking an insulating layer and a wiring pattern layer;

electrically interconnecting said wiring pattern layer through aligned vias in said insulating layer in order to construct a circuit pattern of said wiring pattern layer;

exposing a portion of said wiring pattern layer;

forming a metallic barrier layer of a barrier material on said wiring pattern layer, said metallic barrier layer having an electronic part-mounting region on which an electronic part-mounting pad layer is formed and a barrier metal exclusion zone in which the barrier material is not formed on said wiring pattern layer; and forming an electronic part-mounting pad layer on said metallic barrier layer.

20. A process for fabricating thin multi-layer circuit boards, comprising:

stacking wiring pattern layers and insulating layers, in alternating succession, on an insulating plate-like substrate;

electrically interconnecting said wiring pattern layers through vias in said insulating layers in order to construct a circuit pattern of said wiring pattern layers;

forming a corresponding metallic barrier film on, and partially covering, each wiring pattern layer after forming the wiring pattern layer and preceding the forming of a successive, stacked insulating layer; and wherein said metallic barrier film is formed by a lift-off method.

21. A process for fabricating thin multi-layer circuit boards, comprising:

stacking wiring pattern layers and insulating layers, in alternating succession, on an insulating plate-like substrate;

electrically interconnecting said wiring pattern layers through vias in said insulating layers in order to construct a circuit pattern of said wiring pattern layers;

forming a corresponding metallic barrier film on, and partially covering, each wiring pattern layer after forming the wiring pattern layer and preceding the forming of a successive, stacked insulating layer;

wherein each wiring pattern layer is obtained by forming a first thin chromium film, forming a copper layer on said first thin chromium film, and forming a second thin chromium film on said copper layer; and wherein said metallic barrier film is formed on, and so as to partially cover, said second thin chromium film of the wiring pattern layer.

* * * * *

UNITED STATES PATENT AND TRADEMARK OFFICE
CERTIFICATE OF CORRECTION

PATENT NO. : 5,679,268
DATED : October 21, 1997
INVENTOR(S) : TAKAHASHI et al.

It is certified that error appears in the above-identified patent and that said Letters Patent is hereby corrected as shown below:

Col. 1, line 62, change "Using" to --using--.

Col. 2, line 7, after "electrically" insert --interconnecting said wiring pattern layers through vias in--;
line 8, after "to" insert --constitute-- and delete "interconnecting said wiring pattern layers";
line 9, change "through vias in" to --a--.

Col. 6, line 33, delete "40b,";
line 34, after "pad" insert --40b--;
line 41, change "3μso" to --3μ so--.

Col. 8, line 66, delete "," and after "zone" insert --,--.

Col. 9, line 3, change "3μand" to --3μ and--;
line 8, change "26" to --27--;
line 15, change "patten" to --pattern--.

Col. 14, line 1, begin a new paragraph with "forming";
line 67, change "." to --;-- and begin a new paragraph inserting:
-- forming a gold pad layer of a selected shape on said metallic barrier layer by using said pad-defining resist layer; and
removing said pad-forming resist layer.--

UNITED STATES PATENT AND TRADEMARK OFFICE
CERTIFICATE OF CORRECTION

PATENT NO. : 5,679,268
DATED : October 21, 1997
INVENTOR(S) : TAKAHASHI et al.

It is certified that error appears in the above-identified patent and that said Letters Patent is hereby corrected as shown below:

Col. 15, line 19, after "layers" insert --;--;
line 20, delete "wherein";
line 36, change "pay" to --pad--;
line 50, change "writing" to --wiring--;
line 51, change "cooper" to --copper--;
line 53, change "cooper" to --copper--;
line 54, delete ",";
line 55, after "configuration" insert --of--.

Col. 16, line 4, change "writing" to --wiring--.

Signed and Sealed this

Seventeenth Day of February, 1998

*Attest:*

BRUCE LEHMAN

*Attesting Officer*   Commissioner of Patents and Trademarks